United States Patent
Yamamoto et al.

(10) Patent No.: US 7,619,414 B2
(45) Date of Patent: Nov. 17, 2009

(54) NMR PROBE AND NMR SPECTROMETER

(75) Inventors: Hiroyuki Yamamoto, Kokubunji (JP);
Takanori Ninomiya, Hiratsuka (JP);
Kazuo Saitoh, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 69 days.

(21) Appl. No.: 11/936,820

(22) Filed: Nov. 8, 2007

(65) Prior Publication Data

US 2008/0111548 A1   May 15, 2008

(30) Foreign Application Priority Data

Nov. 9, 2006   (JP)   ............... 2006-304000

(51) Int. Cl.
*G01V 3/00* (2006.01)
(52) U.S. Cl. ...................... 324/318; 324/322
(58) Field of Classification Search ................. 324/318, 324/322
See application file for complete search history.

(56) References Cited

U.S. PATENT DOCUMENTS

| 5,247,256 A | 9/1993 | Marek |
| 5,585,723 A | 12/1996 | Withers |
| 6,958,608 B2 * | 10/2005 | Takagi et al. ................. 324/318 |
| 7,138,801 B2 * | 11/2006 | Yamamoto et al. .......... 324/318 |
| 7,352,186 B2 * | 4/2008 | Hasegawa et al. ........... 324/322 |

FOREIGN PATENT DOCUMENTS

| JP | 2005-003435 | 1/2005 |
| JP | 2005-140651 | 6/2005 |

* cited by examiner

*Primary Examiner*—Louis M Arana
(74) *Attorney, Agent, or Firm*—Antonelli, Terry, Stout & Kraus, LLP.

(57) ABSTRACT

A signal line is drawn from a generally middle point of the antenna coil, and a capacitance-variable capacitors are connected at both sides of the antenna coil. This structure realizes a circuit in which a series resonance circuit composed of an antenna coil and a capacitor and an another series resonance circuit composed of an another antenna coil and an another capacitor are connected in parallel to each other across the generally middle point of the antenna coil to which the signal line is connected. Through the control of the resonance frequencies of the series resonance circuits, the parallel resonance frequency of the whole antenna is tuned to a desired frequency, and the resonance characteristic in which the impedance is matched to a specific value, e.g., 50 Ω, can be achieved.

22 Claims, 17 Drawing Sheets

NMR PROBE AND NMR SPECTROMETER

CLAIM OF PRIORITY

The present application claims priority from Japanese application JP 2006-304000 filed on Nov. 9, 2006, the content of which is hereby incorporated by reference into this application.

BACKGROUND OF THE INVENTION (1) Field of the Invention

The present invention relates to a nuclear magnetic resonance probe (hereinafter referred to as an "NMR probe") and an NMR spectrometer using the same, and more particularly to an NMR spectrometer which is characterized by a circuit configuration and mounting configuration of a probe antenna for transmitting radio frequency signals at a prescribed resonance frequency to a sample placed in a static magnetic field and/or receiving free induction decay (FID) signals.

(2) Description of the Related Arts

Nuclear magnetic resonance (NMR) spectroscopy, by which one can get atomic level information on matter, is an excellent method of analyzing the structure of a compound. The basic principle of analysis by this method is as follows: a sample placed in a static magnetic field is exposed to a radio frequency magnetic field and a response signal from the excited nuclear spin is received and analyzed. For high resolution analysis, an NMR spectrometer which has a superconducting magnet capable of generating a static magnetic field ($B_0$) is employed. Currently, a 21.6 T (920 MHz) NMR spectrometer is available as an NMR spectrometer which is primarily intended to analyze three-dimensional protein structures.

In protein analysis, the sample volume is very small and the intensity of generated free induction decay (FID) signals is weak. Therefore, a probe for receiving FID signals must be highly sensitive. The reduction in thermal noise upon the detection of signals is effective for enhancing a signal-to-noise ratio (S/N) that is the index of the sensitivity for the NMR spectroscopy. Therefore, a method of cooling a probe to a low temperature has been known, and such probe is referred to as a cryogenic probe. The example of a cryogenic probe is disclosed in the U.S. Pat. No. 5,247,256. The signal intensity depends upon a Q factor (quality factor) of a probe antenna, and an antenna should have high Q factor for realizing high-sensitive NMR spectroscopy. Since the Q factor depends upon the resistive loss of an antenna, examples of effective means for enhancing a Q factor include using a low-resistance conductor for fabrication of a probe antenna, cooling a conductor to reduce resistance, or applying a superconductor, which has resistance much smaller than that of a normal metal, to a conductor of a probe antenna. The example of using a superconducting material to a probe antenna is disclosed in U.S. Pat. No. 5,585,723.

SUMMARY OF THE INVENTION

The probe antenna is an LC resonance circuit composed of an inductor and capacitor. It is necessary to match the tuning of the resonance characteristics of the probe antenna in order to perform the NMR measurement. Specifically, the resonance characteristic of the antenna is tuned to the resonance frequency of detected nuclide, and further, the impedance in the resonance frequency is matched to a specific value, such as 50 Ω. Moreover, a high Q factor is required to the antenna circuit for realizing a high-sensitive NMR spectroscopy as described above. For example, a resistance of an antenna coil is reduced to enhance a Q factor in a cryogenic probe.

However, tuning and matching of the resonance characteristic is difficult in the cryogenic probe having extremely small resistance antenna, compared to the normal metal antenna at room temperature, so that it is difficult to obtain an intrinsic high Q factor of an antenna having low loss.

An example of an electric equivalent circuit of a normal probe antenna is shown in FIGS. 1A and 1B. FIG. 1A shows a circuit in which a capacitance-variable capacitor 40 is connected in parallel to an antenna coil 50, and a low-pass matching circuit 48 is connected at the following stage. In this circuit, a resonance peak tuned to a desired frequency $F_0$ is obtained by the inductance of the antenna coil 50 and the capacitance of the capacitor 40, and its impedance is converted to 50 Ω at the matching circuit 48. However, when a resistance 51 attached to the antenna coil 50 is extremely small, the impedance of the obtained resonance peak becomes extremely high. As a result, the circuit parameter (the capacitance of the matching capacitor 44, the inductance of the matching inductor 46) in the matching circuit assumes a value by which a mounting is difficult. Further, the resistances 45 and 47 accompanying the matching capacitor 44 or the matching inductor 46 increase the loss of the whole antenna circuit, thereby reducing the Q factor.

On the other hand, the circuit configuration in FIG. 1B entails a problem that the resistive loss increases due to the increase in the capacitance of the matching capacitor 44. Assuming a material and shape of a popular probe antenna, its capacitance value is not less than several hundred pF. In the case of a chip capacitor generally used in an antenna circuit, the resistance 45 caused by a dielectric loss increases with the increase in the capacitance due to the property of the component. Therefore, when the component having large capacitance is used, the resistive loss of the whole antenna circuit increases, which reduces the Q factor. A probe antenna basically having the circuit configuration shown in FIG. 1B is disclosed in, for example Japanese Patent Laid-Open No. 2005-140651.

Another subject in manufacturing an antenna coil is to increase a self-resonant frequency of the antenna coil. As the number of turns of the antenna coil increases, the intensity of the signal to be detected increases, so that the sensitivity in the NMR spectroscopy can be enhanced. However, the increase in the number of turns of the antenna coil entails the reduction in the self-resonant frequency. When the self-resonant frequency is less than the used frequency, the antenna coil does not function as an inductor, and hence, the NMR signal cannot be detected.

Therefore, an object of the present invention is to provide a circuit configuration and mounting method of a probe antenna that can realize a tuning/matching of a resonance characteristic without reducing an intrinsic high Q factor of an antenna coil, and a circuit configuration and a mounting method of a probe antenna that can increase the number of turns while maintaining a self-resonant frequency to be not less than a used frequency.

In order to realize the probe antenna, a signal line is drawn from a generally middle point of an antenna coil, and capacitance-variable capacitors are connected at both sides of the antenna coil in the present invention. The other electrode of the capacitor is grounded. In the description below, capacitors are defined as capacitance-variable capacitors, but if the adjustment is unnecessary, a fixed capacitor can naturally be employed as the capacitor at one side or capacitors at both sides. Electric power is supplied from both ends of the antenna coil in a conventional probe antenna, while electric power is supplied from a generally middle point of the antenna coil of the present invention, whereby the circuit configuration is greatly different between the conventional antenna coil and the antenna coil of the present invention.

The circuit configuration of the antenna according to the present invention is equivalent to the circuit including a series resonance circuit 1 (shown, for example, in FIG. 2B, as element 70) composed of an antenna coil $L_1$ (i.e., element 50-1, FIG. 2B) and a capacitor $C_1$ (i.e., element 40, FIG. 2B) and a series resonance circuit 2 (i.e., element 71, FIG. 2B) composed of an antenna coil $L_2$ (i.e., element 50-2, FIG. 2B) and a capacitor $C_2$ (i.e., element 41, FIG. 2B), the series resonance circuit 1 (i.e., element 70, FIG. 2B and the series resonance circuit 2 (i.e., element 71, FIG. 2B) being connected in parallel to each other across a generally middle point of an antenna coil to which a signal line is connected. This circuit has a resonance characteristic in which the resonance frequency $F_1$ of the series resonance circuit 1 (i.e., element 70, FIG. 2B) and the resonance frequency $F_2$ of the series resonance circuit 2 appear, and the resonance frequency $F_0$ of the parallel resonance circuit, which is composed of the series resonance circuit 1 (i.e., element 70, FIG. 2B) and the series resonance circuit 2 (i.e., element 71, FIG. 2B), appears at the frequency between $F_1$ and $F_2$. It is understood from the fact that, when the relationship of $F_1<F_2$ is established, the series resonance circuit 1 (i.e., element 71, FIG. 2B) becomes inductive while the series resonance circuit 2 (i.e., element 71, FIG. 2B) becomes capacitive between $F_1$ and $F_2$. The impedance of the parallel resonance peak of the resonance frequency $F_0$ can be changed according to the values of $F_1$ and $F_2$. As the interval between the frequencies $F_1$ and $F_2$ increases, the impedance of the parallel resonance peak increases, and on the contrary, as the interval between the frequencies $F_1$ and $F_2$ decreases, the impedance of the parallel resonance peak decreases. This will be described later. This can be confirmed by analyzing the circuit in which the circuits each having the series resonance circuit 1 (i.e., element 70, FIG. 2B) and the series resonance circuit 2 (i.e., element 71, FIG. 2B) are connected in parallel to each other. Accordingly, the parallel resonance frequency $F_0$ can be tuned to the desired frequency, and the resonance characteristic in which the impedance is matched to a specific value, e.g., 50 Ω, can be achieved only by controlling the series resonance frequencies $F_1$ and $F_2$ through the adjustment of the capacitance values of the capacitors $C_1$ and $C_2$ (i.e., 40 and 41, shown in FIG. 2B).

Since the circuit according to the present invention can basically be composed of only two capacitors other than an antenna coil, the present invention can realize a tuning and matching of a resonance characteristic of an antenna circuit without reducing an intrinsic high Q factor of an antenna coil using a superconductor and having extremely small resistive loss. Further, the inductance of the antenna coil is divided by connecting a signal line in the antenna coil. As a result, the self-resonant frequency of the antenna coil is increased, and the number of turns of the antenna coil can be increased compared to the conventional antenna coil, whereby a signal can be detected with very high sensitivity.

BRIEF DESCRIPTION OF THE DRAWINGS

These and other features, objects and advantages of the present invention will become more apparent from the following description when taken in conjunction with the accompanying drawings wherein.

DETAILED DESCRIPTION OF THE PREFERRED EMBODIMENTS

An embodiment of the present invention will be explained in detail with reference to the drawings.

Figure 1A:
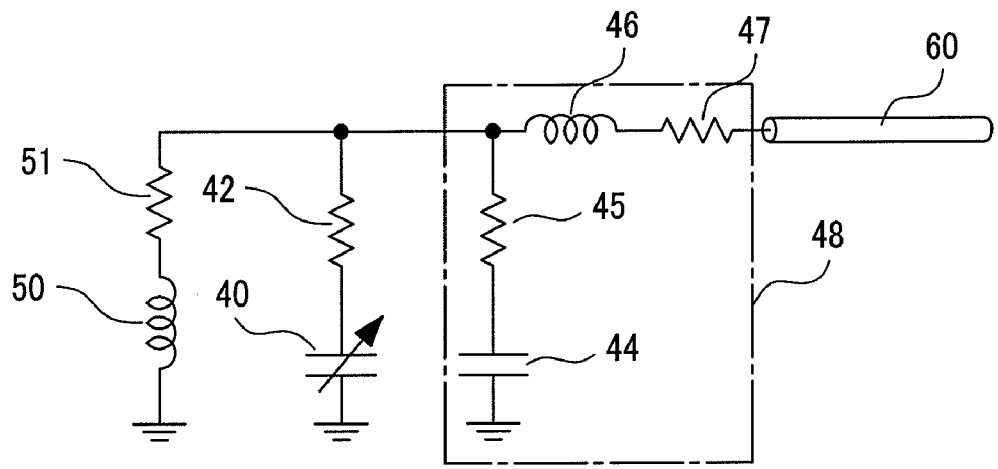
FIGS. 1A and 1B are views showing an example of an electric equivalent circuit in a conventional probe antenna.
Figure 1B:
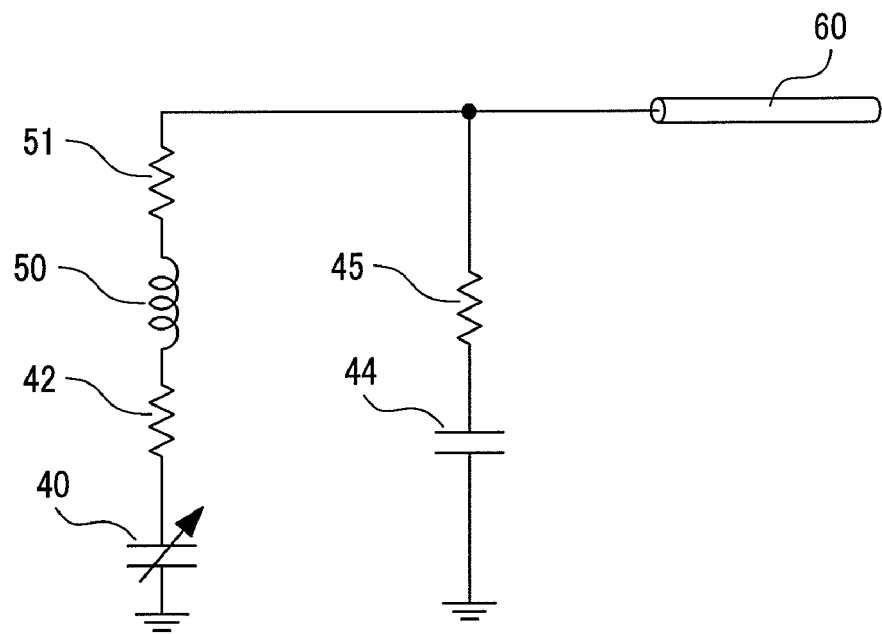
Figure 2A:
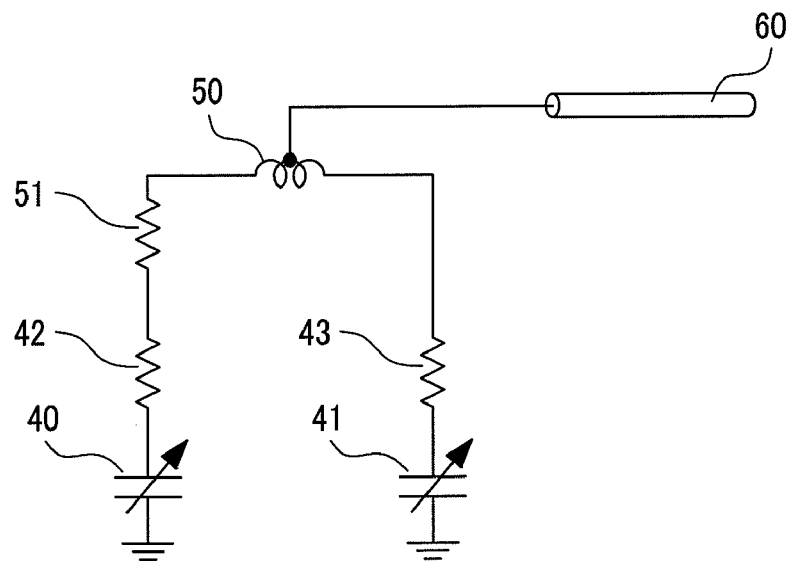
FIG. 2A is an electric equivalent circuit diagram of a probe antenna according to the present invention.
Figure 2B:
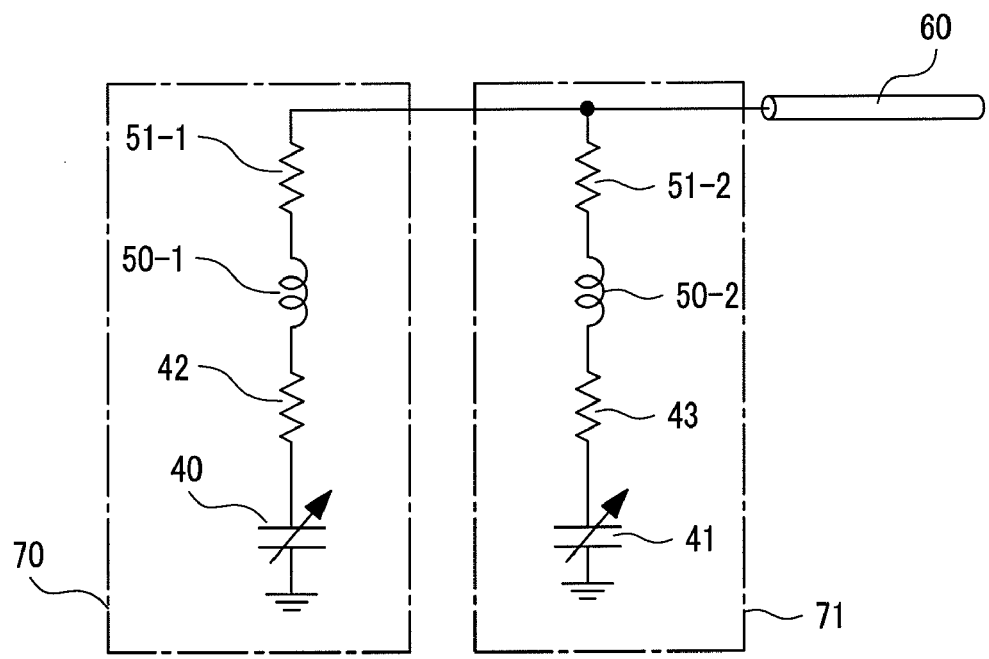
FIG. 2B is an electric equivalent circuit diagram obtained by rewriting the circuit diagram shown in FIG. 2A for better understanding.

FIG. 2A shows an electric equivalent circuit diagram of an antenna circuit according to the present invention. A signal line is drawn from a generally middle point of an antenna coil 50, and capacitors 40 and 41 whose capacitance is variable are connected at both ends of the antenna coil 50. A resistance 51 represents a parasitic resistance of the antenna coil, while resistances 42 and 43 represent resistive loss caused by dielectric loss of the capacitors. FIG. 2B shows an electric equivalent circuit diagram obtained by rewriting the electric equivalent circuit diagram shown in FIG. 2A for better understanding. Since the signal line is drawn from a generally middle point of the antenna coil 50, the inductance of the antenna coil 50 is divided into two inductors 50-1 and 50-2 viewed from the connection of the signal line. For brief explanation, mutual inductance between the inductances 50-1 and 50-2 is neglected. The resistances 51-1 and 51-2 are parasitic resistances of the inductors 50-1 and 50-2. Accordingly, this antenna circuit is a resonance circuit including a series resonance circuit 70 composed of the inductor 50-1, capacitor 40, and resistances 50-1 and 42, and a series resonance circuit 71 composed of the inductors 50-2, capacitor 41, and resistances 50-2 and 43, both series resonance circuits being connected in parallel to each other.

Figure 3A:
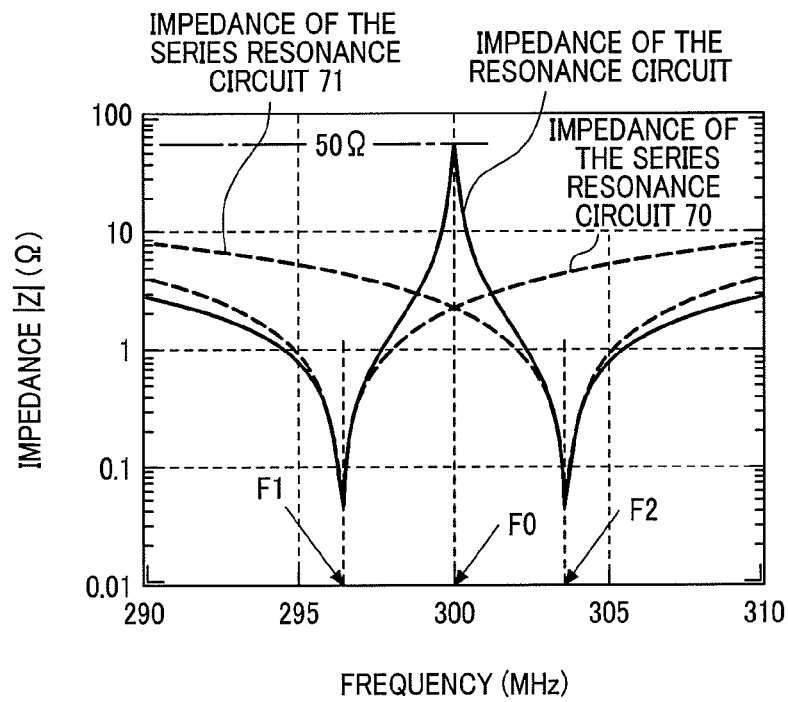
FIG. 3A is a result of a calculation of frequency dependency of impedance in a probe antenna according to the present invention.
Figure 3B:
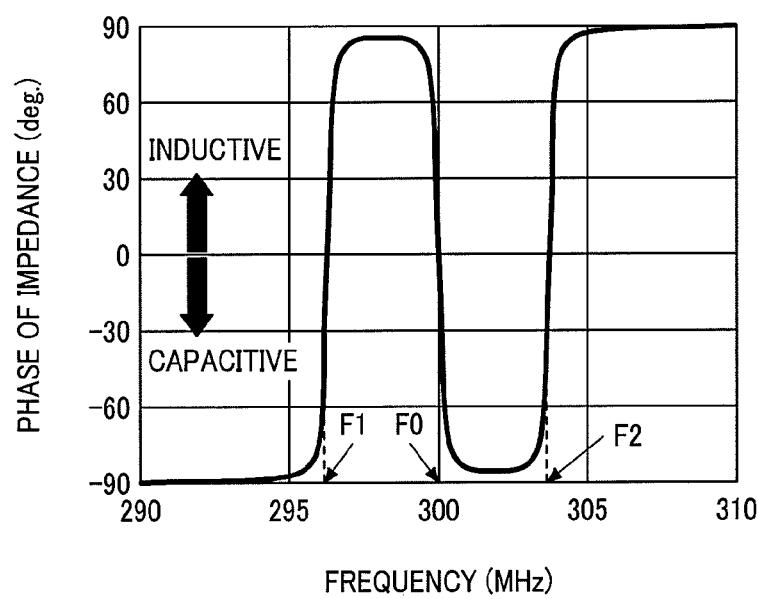
FIG. 3B is a view showing a result of a calculation of frequency dependency of a phase of impedance.

The operation of the antenna circuit will be explained. FIGS. 3A and 3B show a result of a calculation of the resonance characteristic in the antenna circuit. The calculation is made on the assumption that the inductance of the antenna coil is 100 nH and the parasitic resistance of the antenna coil is 100 mΩ. FIG. 3A shows a frequency dependency of an absolute value of the impedance, while FIG. 3B shows a frequency dependency of the phase of the impedance. The broken line in FIG. 3A indicates the frequency dependency of the impedance of the series resonance circuit 70 and the series resonance circuit 71 independently. The solid line indicates the impedance of the resonance circuit having the series resonance circuits 70 and 71 connected in parallel to each other. From these graphs, it is found that, as the resonance characteristic of the whole antenna circuit, series resonance dips appear at the frequencies $F_1$ and $F_2$, and a parallel resonance peak appears at the resonance frequency $F_0$ at the generally middle point of these frequencies $F_1$ and $F_2$. As understood from FIG. 3A, the frequencies $F_1$ and $F_2$ of the resonance dips coincide with the series resonance frequencies of the series resonance circuits 70 and 71, and they can independently be controlled by adjusting the capacitance values of the capacitors 40 and 41. Since the parallel resonance frequency $F_0$ changes according to the values of the series resonance frequencies $F_1$ and $F_2$, $F_0$ can be tuned to a desired frequency by adjusting $F_1$ and $F_2$. Since the series resonance circuit 70 becomes inductive and the series resonance circuit 71 becomes capacitive between $F_1$ and $F_2$, the antenna circuit having the series resonance circuits 70 and 71 connected in parallel to each other can be resonated in parallel at the frequency $F_0$ between $F_1$ and $F_2$.

Figure 4:
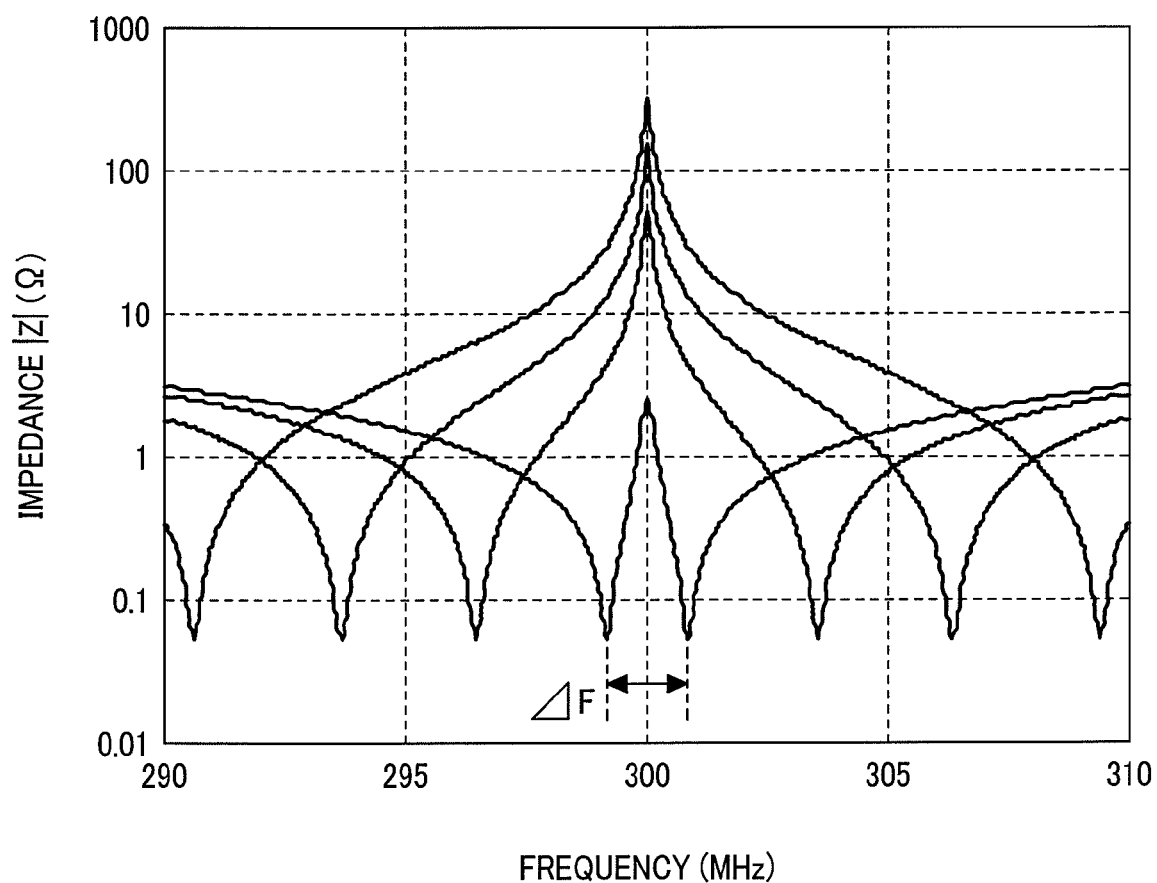
FIG. 4 is a graph showing a result of a calculation in which the impedances in the probe antenna according to the present invention are plotted to indicate the state where the impedances change according to the difference ΔF between the series resonance frequencies F1 and F2.

The impedance of the parallel resonance peak at the frequency $F_0$ depends upon the difference between the series resonance frequencies $F_1$ and $F_2$. FIG. 4 is a graph in which the impedances in the case of changing the interval $\Delta F$ between $F_1$ and $F_2$ are plotted. As the interval $\Delta F$ increases, the impedance of the parallel resonance peak increases. On the contrary, as the interval $\Delta F$ decreases, the impedance of the parallel resonance peak lowers. Accordingly, the impedance can be matched to a specific value, e.g., 50 Ω by controlling the interval $\Delta F$ between $F_1$ and $F_2$.

Embodiment 1

Figure 5:
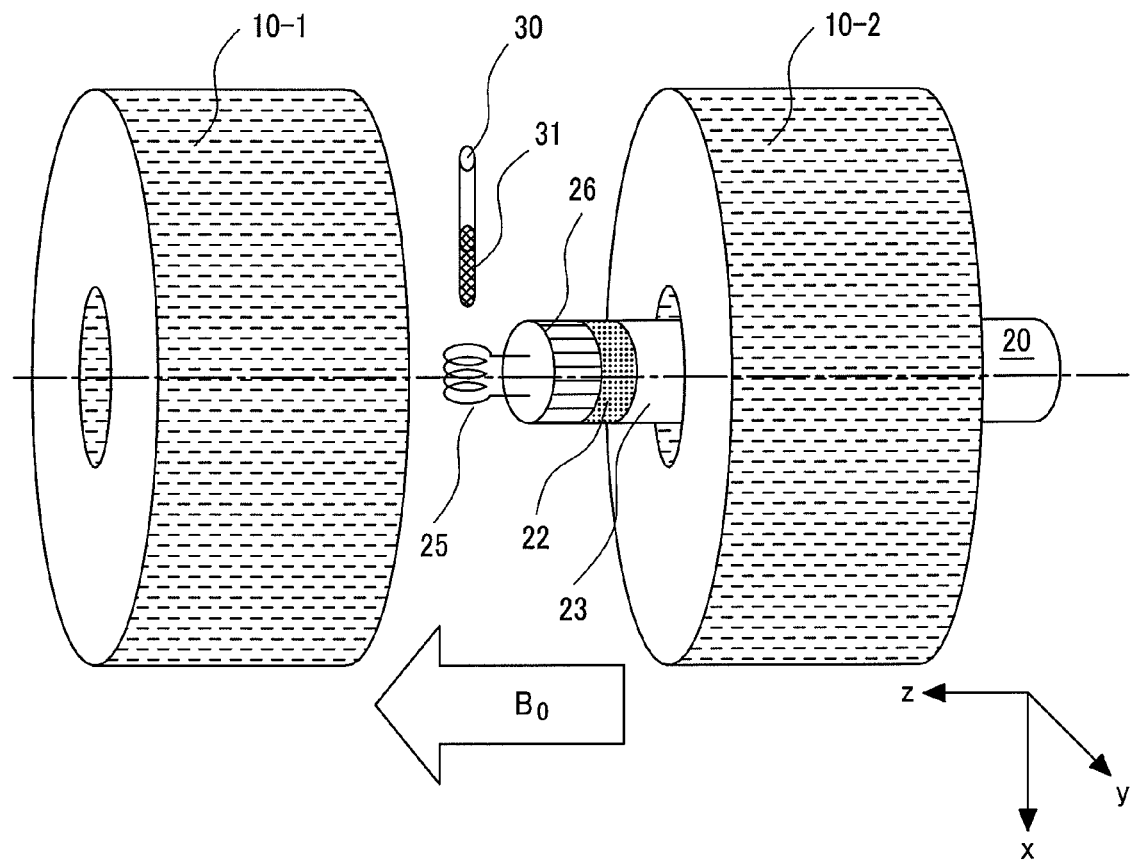
FIG. 5 is a perspective view schematically showing a main component section of an NMR spectrometer, which is a subject of the present invention, in which the probe antenna 25 is inserted from a bore of a split-type superconducting magnet.

FIG. 5 is a perspective view showing an outline of main components of an NMR spectroscopy and their arrangement. A uniform magnetic field is produced along a centerline indicated by one-dot-chain line by superconducting magnets 10-1 and 10-2 divided into two. The produced magnetic field is indicated by an arrow $B_0$. A sample tube 30 stores a sample 31 therein and is inserted from the direction (X-axis direction in the Figure) perpendicular to the static magnetic field. A cryogenic probe 20 having mounted thereto a solenoid-shaped probe antenna 25 for detecting a signal from the sample 31 is inserted from the direction same as the static magnetic field. The cryogenic probe 20 is composed of a probe antenna 25, a heat exchanger 22 at a leading end of a cryocooler serving as a cryogenic source, a leading-end stage 26 of the probe cooled by the heat exchanger, and a probe housing 23 that joint these components.

Figure 6A:
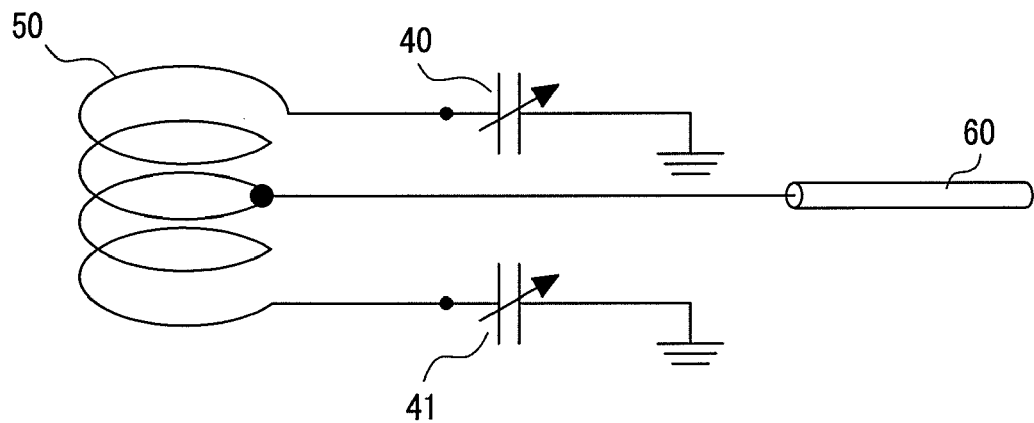
FIG. 6A is a view schematically showing an electrical connection of a solenoid-type probe antenna according to the embodiment 1.

FIG. 6A is a schematic view showing an electrical connection of the solenoid-shaped probe antenna according to the embodiment 1. A signal line 60 is drawn from a generally middle point of the antenna coil, and capacitors 40 and 41 whose capacitance value is variable are connected at both ends of the antenna coil 50. The other electrodes of the capacitors are grounded.

Figure 6B:
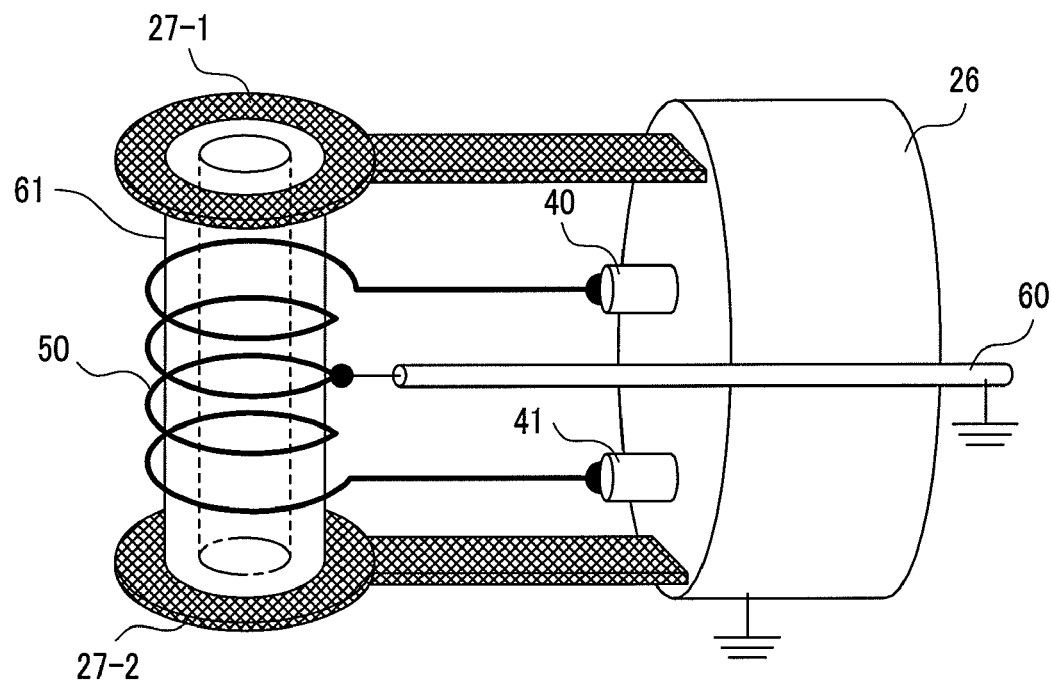
FIG. 6B is a perspective view schematically showing a manner of mounting a solenoid-type probe antenna to a cryogenic probe 20.

FIG. 6B is a perspective view schematically showing a manner of mounting the solenoid-shaped probe antenna to the cryogenic probe 20. A cylindrical bobbin 61 is fixed between two hold plates 27-1 and 27-2, and an antenna coil 50 is wound around the bobbin 61. A signal line 60 is connected to generally the middle point of the antenna coil 50, and both ends of the coil are connected to capacitors 40 and 41. The other sides of the capacitors 40 and 41 or the outer cover of the signal line 60 is electrically and mechanically connected to a probe leading-end stage 26 made of a metallic material. The antenna coil 50 is made of a wire of a superconductor NbTi, and the hold plates 27-1 and 27-2 and the cylindrical bobbin 61 are made of sapphire ($Al_2O_3$). In the present embodiment, the thickness of the wire is 1 mm, the diameter of the antenna coil is 7 mm, and the number of turns of the antenna coil is four.

Although not shown, the probe leading-end stage 26 is thermally connected to the heat exchanger at the leading end of the cryocooler serving as a cryogenic source so as to be cooled to very low temperature. The probe leading-end stage 26 and the hold plates 27-1, 27-2 and the cylindrical bobbin 61 are also thermally connected to each other. Therefore, the antenna coil 50 is cooled to very low temperature with heat transmission through the cylindrical bobbin 61 and the hold plates 27-1 and 27-2.

Figure 7:
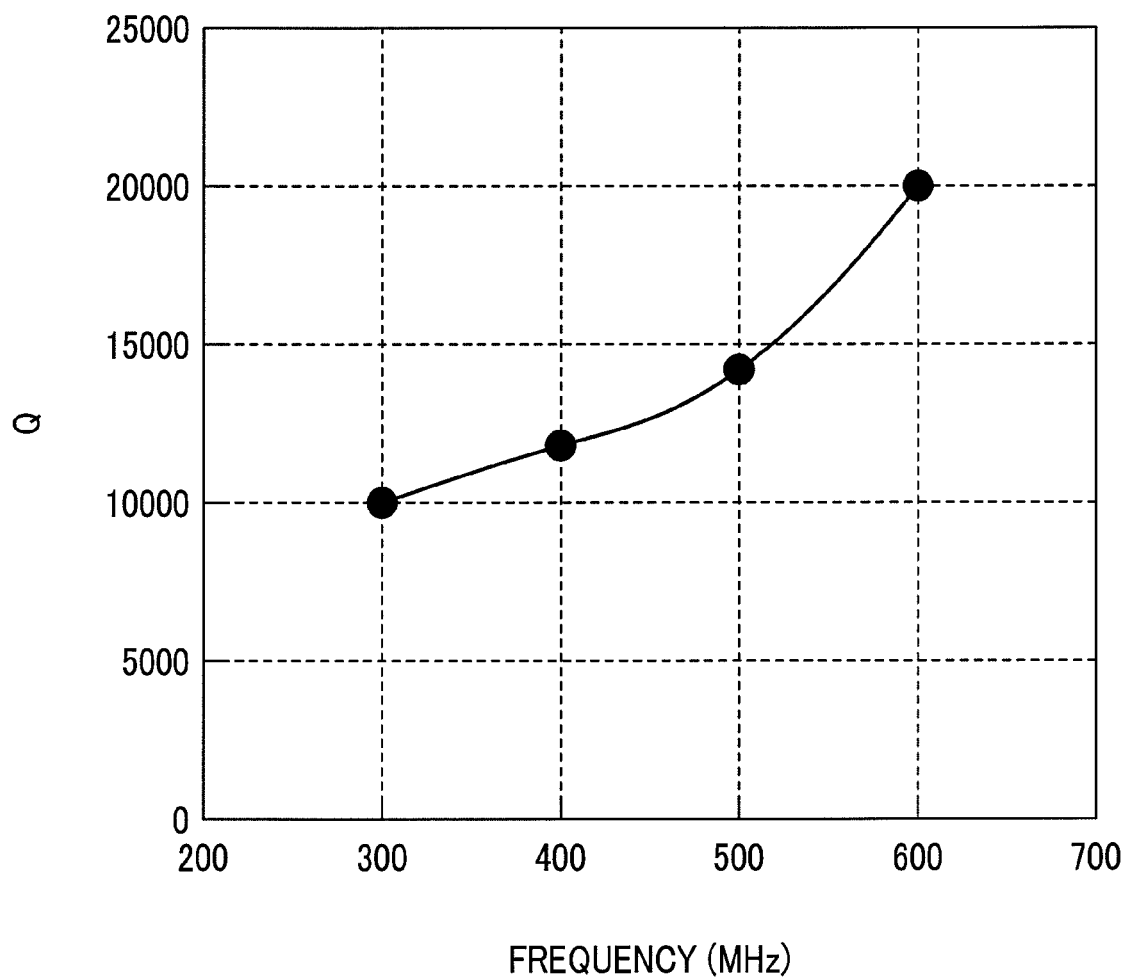
FIG. 7 is a graph showing a frequency dependency of a Q factor in the solenoid-type probe antenna according to the embodiment 1.

The resonance characteristic was evaluated in liquid helium (4.2 K) with the cylindrical bobbin 61 and the hold plates 27-1 and 27-2 removed. The result of the measurement of the frequency dependency of the Q factor is shown in FIG. 7. The resonance characteristic matched to 50 Ω at 300 to 600 MHz was confirmed, and Q=10000 to 20100 was established. The Q factor of the superconducting antenna to which the antenna configuration of the present invention is not applied is not more than 200, so that it was confirmed that the application of the present invention could provide intrinsic low-loss performance of the superconducting antenna. By using the probe antenna having the configuration described above to an NMR spectrometer, the great improvement in S/N ratio can be realized.

NbTi was used as the superconducting material in the embodiment 1. It is apparent that the same effect can be obtained when the other Nb alloy ($Nb_3Sn$), magnesium diboride ($MgB_2$), or oxide high-temperature superconductor such as YBCO is used for the superconducting material of the antenna coil in the same configuration. Further, it is apparent that the same configuration is possible when a normal metal material such as Cu wire is used instead of the superconducting material. Although sapphire is used for the hold plates 27-1 and 27-2 and the cylindrical bobbin 61, the same result can be obtained even when aluminum nitride (AlN) is used instead.

The embodiment 1 shows the antenna configuration of a low-temperature operation. However, even when the configuration of the present embodiment is applied to an antenna of a room-temperature operation using a normal metal such as Cu, the improvement in the sensitivity of the NMR spectroscopy can be realized compared to the conventional room-temperature operation antenna. The antenna configuration shown in the embodiment 1 in which the junction of the signal line is provided in the antenna coil can increase self-resonance frequency of the antenna coil compared to the conventional antenna in which the junction of the signal line is positioned at the end portion of the antenna coil. Therefore, the number of turns of the antenna coil can be increased, thereby being capable of enhancing the sensitivity of NMR spectroscopy. For example, although a solenoid-shaped antenna coil having four turns is difficult to be applied to the spectroscopy at 600 MHz in the conventional configuration, a solenoid-shaped antenna coil that has four turns, is operated at room temperature and to which the configuration of the embodiment 1 is applied can be applied for the spectroscopy at 600 MHz.

Embodiment 2

Figure 8A:
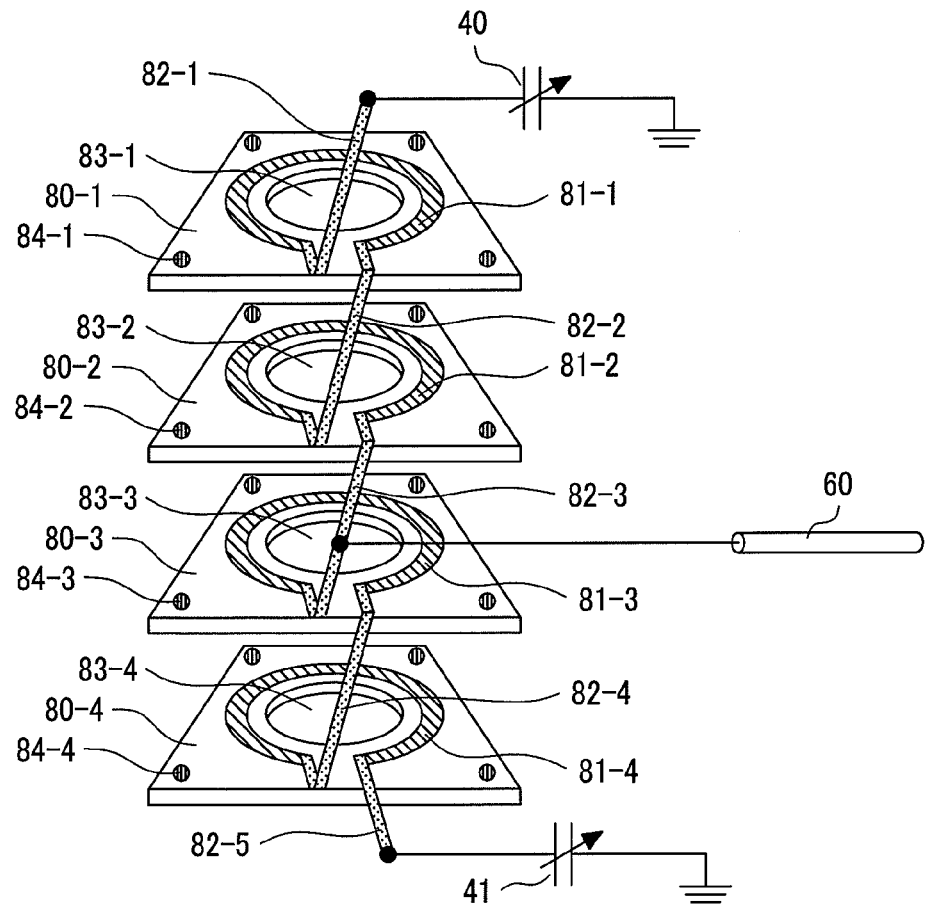
FIG. 8A is a view schematically showing a structure of a solenoid-type probe antenna according to the embodiment 2.

The embodiment 2 proposes an antenna using a superconducting thin film. The shape of the antenna is a solenoid type similar to that in the embodiment 1. FIG. 8A schematically shows the structure of the probe antenna in the embodiment 2. The antenna coil in the embodiment 2 is composed of superconducting thin film coils 81-1, 81-2, 81-3, and 81-4 formed on substrates 80-1, 80-2, 80-3, and 80-4, and normal metal tapes 82-1, 82-2, 82-3, 82-4, and 82-5 which electrically connect the coils. The signal line 60 is connected to the normal metal tape 82-3 that connects the second and third superconducting thin film coils. The capacitors 40 and 41 are connected to the normal metal tapes 82-1 and 82-5 serving as the end portions of the antenna coil.

Figure 8B:
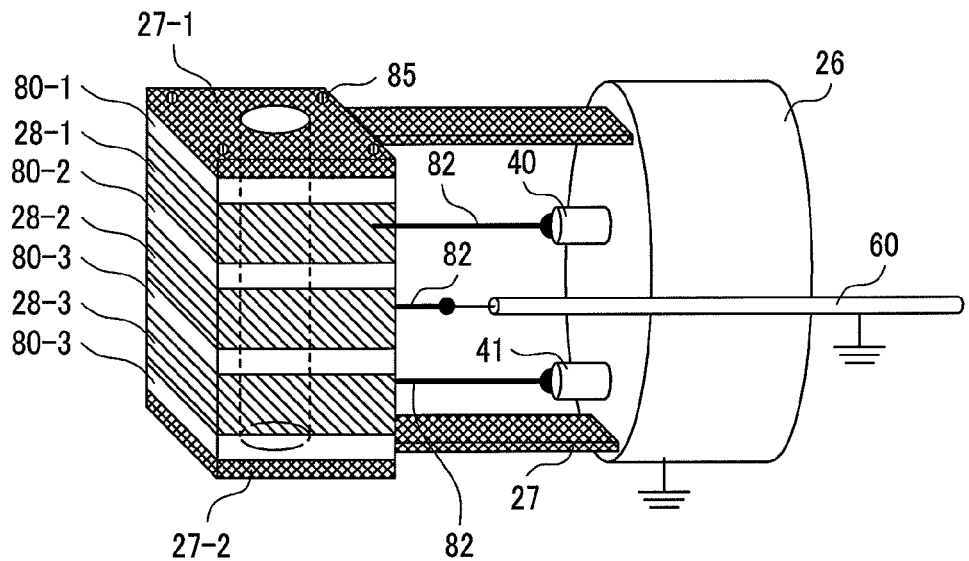
FIG. 8B is a perspective view schematically showing a manner of mounting the solenoid-type probe antenna according to the embodiment 2 to a cryogenic probe 20.

FIG. 8B is a perspective view schematically showing the manner of mounting the solenoid-shaped probe antenna to a cryogenic probe 20. The substrates 80-1, 80-2, 80-3, and 80-4 having the superconducting thin film coils 81-1, 81-2, 81-3, and 81-4 formed thereon and spacers 28-1, 28-2, and 28-3 are alternately stacked and sandwiched between two hold plates 27-1 and 27-2. A hole is formed at the center of the laminate of the hold plates 27-1, 27-2, spacers 28-1, 28-2, 28-3, and substrates 80-1, 80-2, 80-3, and 80-4 so as to assemble as a probe antenna, whereby a sample tube can be inserted therein.

The method of manufacturing the probe antenna will be explained below. Firstly, an $MgB_2$ superconducting thin film having a thickness of 300 nm is formed by a vapor deposition on the substrates 80-1, 80-2, 80-3, and 80-4 made of sapphire ($Al_2O_3$). The material of the substrates is sapphire. Next, the superconducting thin film is patterned into a washer shape by photolithography and electron cyclotron resonance etching. The internal diameter of the coil pattern is 11 mm, and the line width is 1 mm. Then, holes 83-1, 83-2, 83-3 and 83-4 through which the sample tube is inserted, and screw holes 84-1, 84-2, 84-3, and 84-4 are formed by a laser beam irradiation. Then, the normal metal tapes 82-1, 82-3, 82-3, 82-4, and 82-5 are connected to the end portions of the superconducting thin film coils 81-1, 81-2, 81-3, and 81-4 by ultrasonic bonding method.

Thereafter, the substrates for the superconducting thin films 80-1, 80-2, 80-3, and 80-4 and the spacers 28-1, 28-2, and 28-3 are alternately stacked, and the resultant is fixed between the hold plates 27-1 and 27-2 by clamping screws. Upon the assembly, indium in a small amount is filled between the substrates 80-1, 80-2, 80-3, and 80-4, spacers 28-1, 28-2, and 28-3 and the hold plates 27-1 and 27-2 so as to obtain satisfactory thermal connection. The spacers 28-1, 28-2, and 28-3 and the hold plates 27-1 and 27-2 are made of sapphire ($Al_2O_3$).

Like the embodiment 1, the probe leading-end stage 26 is thermally connected to the heat exchanger at the leading end of the cryocooler serving as a cryogenic source so as to be cooled to very low temperature. The superconducting thin film coils 81-1, 81-2, 81-3, and 81-4 are cooled to very low temperature with heat transmission through the substrates 80-1, 80-2, 80-3, and 80-4, spacers 28-1, 28-2, and 28-3 and the hold plates 27-1 and 27-2.

The Q factor of the thus manufactured superconducting probe antenna was measured in liquid helium (4.2 K), and as a result, the resonance characteristic matched to 50 Ω at 300 to 600 MHz was confirmed to obtain Q=6500 to 10100. The Q factor of the superconducting antenna to which the antenna configuration of the present invention is not applied is not more than 2000, so that it was confirmed that the application of the present invention could provide intrinsic low-loss performance of the superconducting antenna. By using the probe antenna having the configuration described above to an NMR spectrometer, the great improvement in S/N ratio can be realized.

Magnesium diboride ($MgB_2$) was used as the superconducting material in the embodiment 2. It is apparent that the same effect can be obtained when the other Nb alloy ($Nb_3Sn$, NbTi, etc.), or oxide high-temperature superconductor such as YBCO is used for the superconducting material of the antenna coil in the same configuration. Further, it is apparent that the same configuration is possible when a normal metal material such as Cu wire is used instead of the superconducting material. Although sapphire is used for the substrates 80-1, 80-2, 80-3, and 80-4, the spacers 28-1, 28-2, 28-3, and the hold plates 27-1 and 27-2, the same result can be obtained even when aluminum nitride (AlN) is used instead.

The embodiment 2 shows the antenna configuration of a low-temperature operation. However, even when the configuration of the present embodiment is applied to an antenna of a room-temperature operation using a normal metal such as Cu, the improvement in the sensitivity of the NMR spectroscopy can be realized compared to the conventional room-temperature operation antenna. The antenna configuration shown in the embodiment 2 in which the junction of the signal line is provided in the antenna coil can increase self-resonant frequency of the antenna coil compared to the conventional antenna in which the junction of the signal line is positioned at the end portion of the antenna coil. Therefore, the number of turns of the antenna coil can be increased, thereby being capable of enhancing the sensitivity of NMR spectroscopy.

For example, although a solenoid-shaped antenna coil having four turns is difficult to be applied to the spectroscopy at 600 MHz in the conventional configuration, a solenoid-shaped antenna coil that has four turns, is operated at room temperature and to which the configuration of the embodiment 2 is applied can be applied for the spectroscopy at 600 MHz.

Embodiment 3

Figure 9:
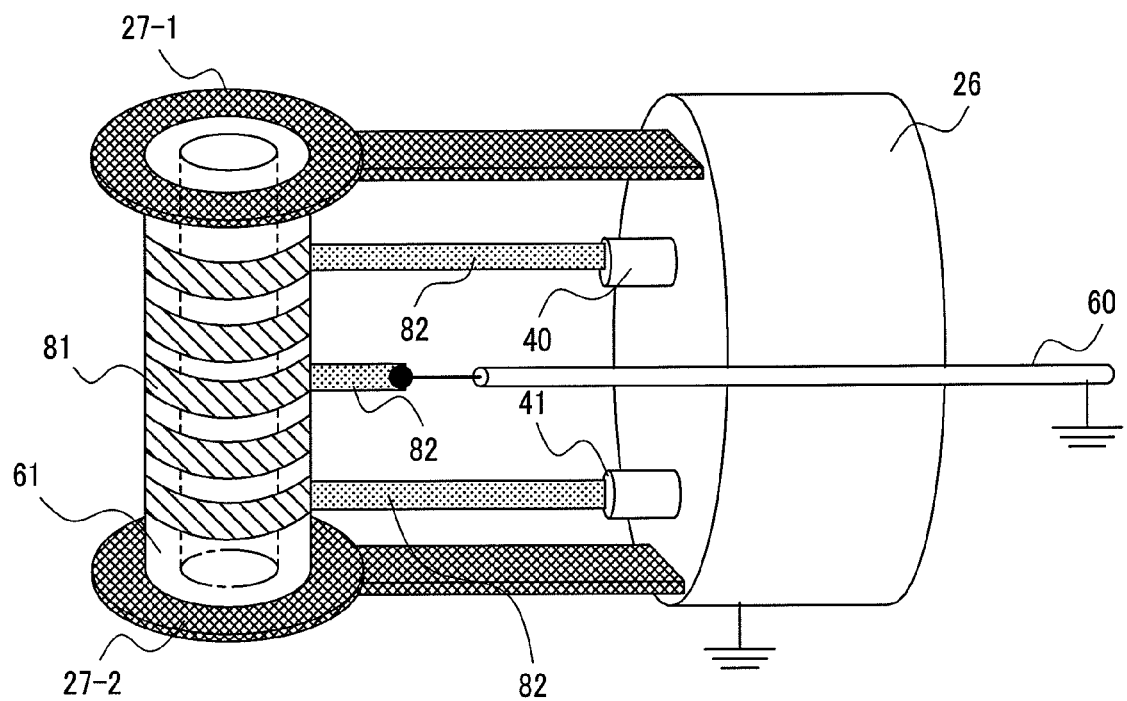
FIG. 9 is a view schematically showing a structure of a solenoid-type probe antenna according to the embodiment 3.

The embodiment 3 proposes a solenoid-shaped antenna to which a superconducting thin film is applied like the embodiment 2. FIG. 9 is a perspective view schematically showing the structure of the probe antenna according to the embodiment 3. The basic structure of the probe antenna is the same as that in the embodiment 1. In the embodiment 3, the antenna coil is composed of a superconducting thin film 81 patterned onto the cylindrical bobbin 61 and normal metal tapes 82-1 and 82-2.

A method of manufacturing the probe antenna will be explained below. Firstly, an $MgB_2$ superconducting thin film having a thickness of 300 nm is formed by a vapor deposition on the cylindrical bobbin 61 made of sapphire ($Al_2O_3$). Then, the formed superconducting thin film is mechanically grinded to form a helical pattern of the superconducting thin film having a width of 1 mm on the cylindrical bobbin 61. Thereafter, the normal metal tapes 82-1, 82-2, and 82-3 are connected to the generally middle point and both end portions of the helical pattern of the superconducting thin film with an ultrasonic bonding method so as to form the antenna coil. The antenna coil is fixed by using the hold plates 27-1 and 27-2, and the normal metal wirings 82-1, 82-2, and 82-3 are connected to the capacitors 40 and 41 and the signal line 60. Thus, the probe antenna is manufactured.

Like the embodiment 1, the probe leading-end stage 26 is thermally connected to the heat exchanger at the leading end of the cryocooler serving as a cryogenic source so as to be cooled to very low temperature. The superconducting thin film 81 is cooled to very low temperature with heat transmission through the cylindrical bobbin and the hold plates 27-1 and 27-2.

As a result of measuring the Q factor of the thus manufactured superconducting probe antenna in liquid helium (4.2 K), the resonance characteristic matched to 50 Ω at 300 to 600 MHz was confirmed, and the Q factor equivalent to that of the probe antenna in the embodiment 2 could be obtained. By using the probe antenna having the configuration described above to an NMR spectrometer, the great improvement in S/N ratio can be realized.

Magnesium diboride ($MgB_2$) was used as the superconducting material in the embodiment 3. It is apparent that the same effect can be obtained when the other Nb alloy ($Nb_3Sn$, NbTi, etc.), or oxide high-temperature superconductor such as YBCO is used for the superconducting material of the antenna coil in the same configuration. Further, it is apparent that the same configuration is possible when a normal metal material such as Cu wire is used instead of the superconducting material. Although sapphire is used for the cylindrical bobbin 61 and the hold plates 27-1 and 27-2 in the embodiment 3, the same result can be obtained even when aluminum nitride (AlN) is used instead.

The embodiment 3 shows the antenna configuration of a low-temperature operation. However, even when the configuration of the present embodiment is applied to an antenna of a room-temperature operation using a normal metal such as Cu, the improvement in the sensitivity of the NMR spectroscopy can be realized compared to the conventional room-temperature operation antenna. The antenna configuration shown in the embodiment 3 in which the junction of the signal line is provided in the antenna coil can increase self-resonance frequency of the antenna coil compared to the conventional antenna in which the junction of the signal line is positioned at the end portion of the antenna coil. Therefore, the number of turns of the antenna coil can be increased, thereby being capable of enhancing the sensitivity of NMR spectroscopy. For example, although a solenoid-shaped antenna coil having four turns is difficult to be applied to the spectroscopy at 600 MHz in the conventional configuration, a solenoid-shaped antenna coil that has four turns, is operated at room temperature and to which the configuration of the embodiment 3 is applied can be applied for the spectroscopy at 600 MHz.

Embodiment 4

Figure 10:
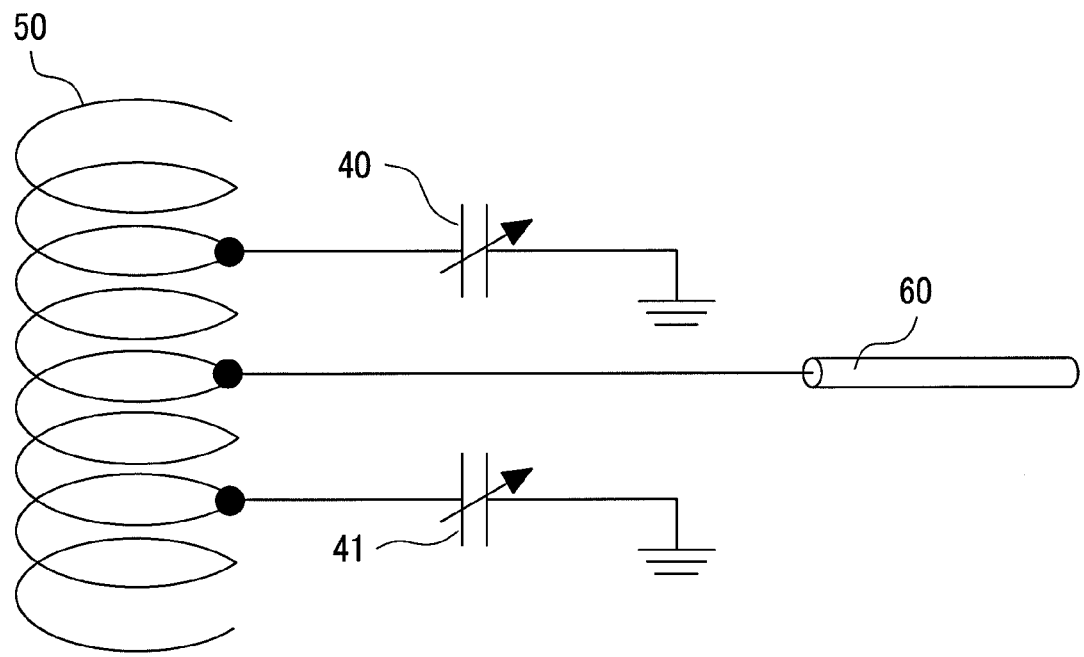
FIG. 10 is a view schematically showing a structure of a solenoid-type probe antenna according to the embodiment 4.

The embodiment 4 proposes a solenoid-shaped probe antenna in which both ends of an antenna coil are open. FIG. 10 schematically shows the structure of the probe antenna in the embodiment 4. The basic structure is the same as that in the embodiment 1, but in the embodiment 4, the wire of the antenna coil 50 extends outward from the connecting point of the capacitors 40 and 41, and the end portions of the antenna coil are open. The length of the antenna coil extending outward from the connection point of the capacitors 40 and 41 and the antenna coil 50 is featured by a fourth or integral multiple of the wavelength of electromagnetic wave in the used resonance frequency.

The probe antenna in the embodiment 4 is self-resonated at the resonance frequency used by only the antenna coil 50. With this state, the capacitance values of the capacitors 40 and 41 are adjusted so as to match the impedance at the junction of the signal line 60 and the antenna coil 50 to 50 Ω. The advantage of the structure of the antenna is that the signal from the sample inserted into the antenna can be detected in a wide area by extending the wire of the antenna coil in the direction of inserting the sample tube.

The mounting manner to the cryogenic probe and the cooling method of the antenna coil are the same as those shown in the embodiment 1. A wire of superconducting NbTi was used to manufacture the antenna coil, and the resonance characteristic was evaluated in liquid helium (4.2 K). As a result, the resonance frequency matched to 50 Ω at 300 to 600 MHz was confirmed, and the Q factor equivalent to that of the probe antenna in the embodiment 1 could be obtained. By using the probe antenna having the configuration described above to an NMR spectrometer, the great improvement in S/N ratio can be realized.

NbTi was used as the superconducting material in the embodiment 4. It is apparent that the same effect can be obtained when the other Nb alloy ($Nb_3Sn$), magnesium diboride ($MgB_2$), or oxide high-temperature superconductor such as YBCO is used for the superconducting material of the antenna coil in the same configuration. Further, it is apparent that the same configuration is possible when a normal metal material such as Cu wire is used instead of the superconducting material.

The embodiment 4 shows the antenna configuration of a low-temperature operation. However, even when the configuration of the present embodiment is applied to an antenna of a room-temperature operation using a normal metal such as Cu, the improvement in the sensitivity of the NMR spectroscopy can be realized compared to the conventional room-temperature operation antenna. The antenna configuration shown in the embodiment 4 in which the junction of the signal line is provided in the antenna coil can increase self-resonance frequency of the antenna coil compared to the conventional antenna in which the junction of the signal line is positioned at the end portion of the antenna coil. Therefore, the number of turns of the antenna coil can be increased, thereby being capable of enhancing the sensitivity of NMR spectroscopy. For example, although a solenoid-shaped antenna coil having four turns is difficult to be applied to the spectroscopy at 600 MHz in the conventional configuration, a solenoid-shaped antenna coil that has four turns, is operated at room temperature and to which the configuration of the embodiment 4 is applied can be applied for the spectroscopy at 600 MHz.

Embodiment 5

Figure 11:
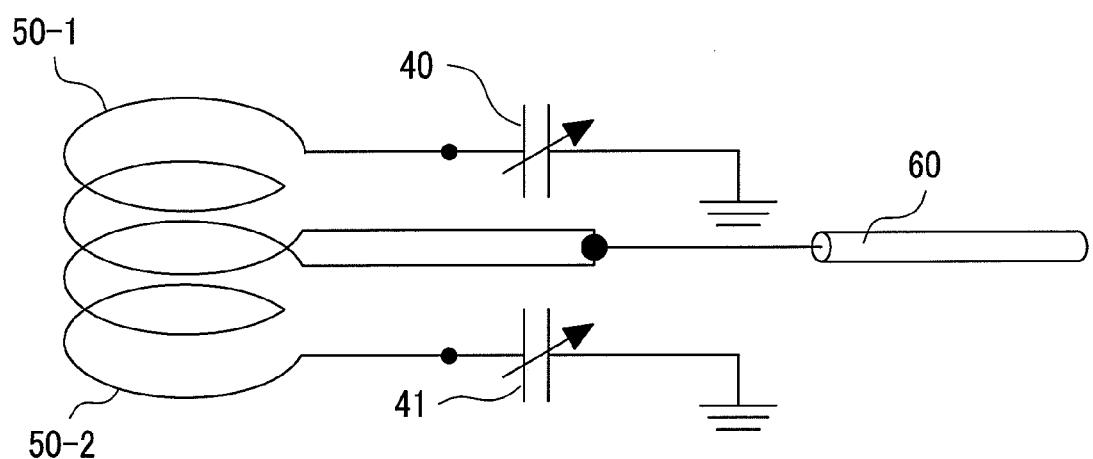
FIG. 11 is a view schematically showing a structure of a solenoid-type probe antenna according to the embodiment 5.

The embodiment 5 proposes a solenoid-shaped probe antenna in which plural coils are connected to form an antenna coil. FIG. 11 shows the structure of the probe antenna according to the embodiment 5. The basic structure is the same as that in the embodiment 1. Two separate antenna coils 50-1 and 50-2 are arranged at the position capable of detecting the signal from the sample, and a capacitance-variable capacitor is connected to one end of each coil. The other ends of each coil are electrically connected to each other, and the signal line 60 is drawn from the junction.

The mounting manner to the cryogenic probe and the cooling method of the antenna coil are the same as those shown in the embodiment 1. A wire of superconducting NbTi was used to manufacture the antenna coil, and the resonance characteristic was evaluated in liquid helium (4.2 K). As a result, the resonance characteristic matched to 50 Ω at 300 to 600 MHz was confirmed, and the Q factor equivalent to that of the probe antenna in the embodiment 1 could be obtained. By using the probe antenna having the configuration described above to an NMR spectrometer, the great improvement in S/N ratio can be realized.

NbTi was used as the superconducting material in the embodiment 5. It is apparent that the same effect can be obtained when the other Nb alloy ($Nb_3Sn$), magnesium diboride ($MgB_2$), or oxide high-temperature superconductor such as YBCO is used for the superconducting material of the antenna coil in the same configuration. Further, it is apparent that the same configuration is possible when a normal metal material such as Cu wire is used instead of the superconducting material.

The embodiment 5 shows the antenna configuration of a low-temperature operation. However, even when the configuration of the present embodiment is applied to an antenna of a room-temperature operation using a normal metal such as Cu, the improvement in the sensitivity of the NMR spectroscopy can be realized compared to the conventional room-temperature operation antenna. The antenna configuration shown in the embodiment 5 in which the junction of the signal line is provided in the antenna coil can increase self-resonance frequency of the antenna coil compared to the conventional antenna in which the junction of the signal line is positioned at the end portion of the antenna coil. Therefore, the number of turns of the antenna coil can be increased, thereby being capable of enhancing the sensitivity of NMR spectroscopy. For example, although a solenoid-shaped antenna coil having four turns is difficult to be applied to the spectroscopy at 600 MHz in the conventional configuration, a solenoid-shaped antenna coil that has four turns, is operated at room temperature and to which the configuration of the embodiment 5 is applied can be applied for the spectroscopy at 600 MHz.

Embodiment 6

Figure 12:
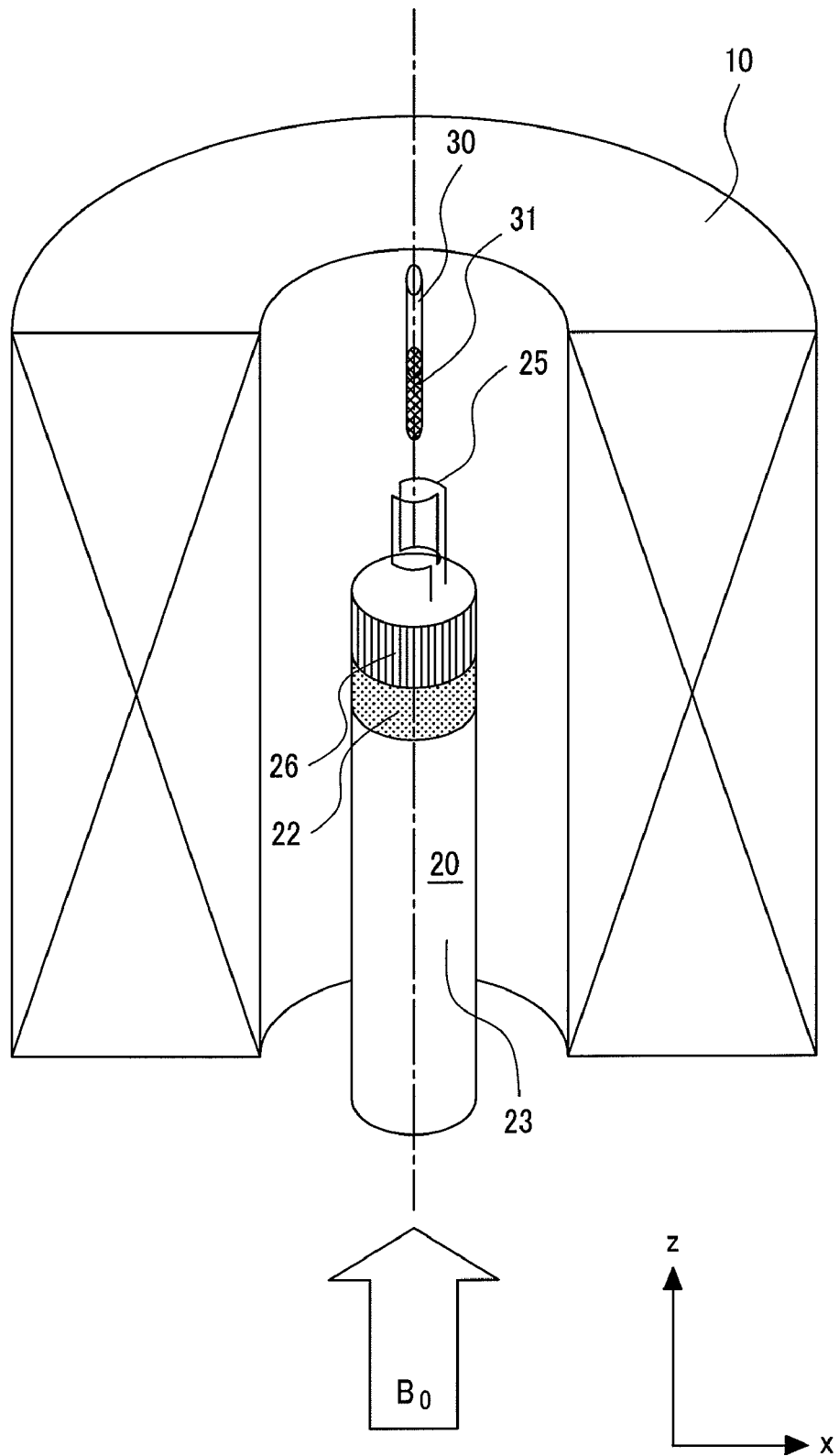
FIG. 12 is a view showing a typical structure of an NMR spectrometer that produces a static magnetic field in the vertical direction.

The embodiment 6 proposes a structure of a saddle-shaped probe antenna. The saddle-shaped probe antenna can be applied to an NMR spectrometer that generates a static magnetic field ($B_0$) in the vertical direction by using a cylindrical magnet. FIG. 12 shows a typical configuration of an NMR spectrometer generating a static magnetic filed in the vertical direction. A cylindrical superconducting magnet 10 produces a uniform magnetic field along a centerline indicated by a one-dot-chain line. A cryogenic probe 20 and a sample tube 30 having a sample 31 stored therein are inserted from the direction same as the static magnetic field (z-axis direction in the Figure). The cryogenic probe 20 is composed of a probe antenna 25, a heat exchanger 22 at the leading end of a cryocooler serving as a cryogenic source, a probe leading-end stage 26 cooled by the heat exchanger, and a probe housing 23 that joint these components.

Figure 13A:
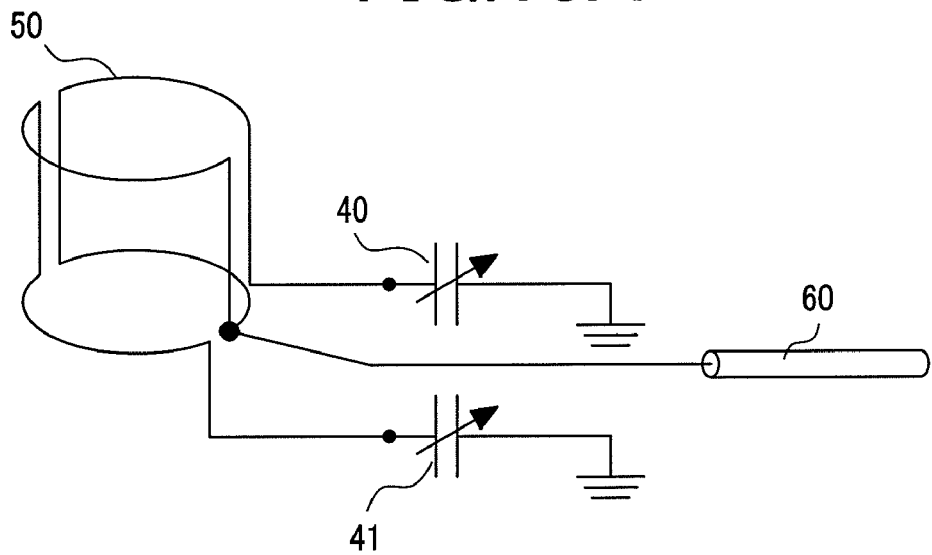
FIG. 13A is a view schematically showing a structure of a saddle-type probe antenna according to the embodiment 6.

FIG. 13A is a view schematically showing an electrical connection of the saddle-shaped probe antenna according to the embodiment 6. The antenna coil has a saddle shape. The signal line 60 is drawn from a generally middle point of the antenna coil 50, and capacitance-variable capacitors 40 and 41 are connected to both ends of the antenna coil 50. The other ends of the capacitors are grounded.

Figure 13B:
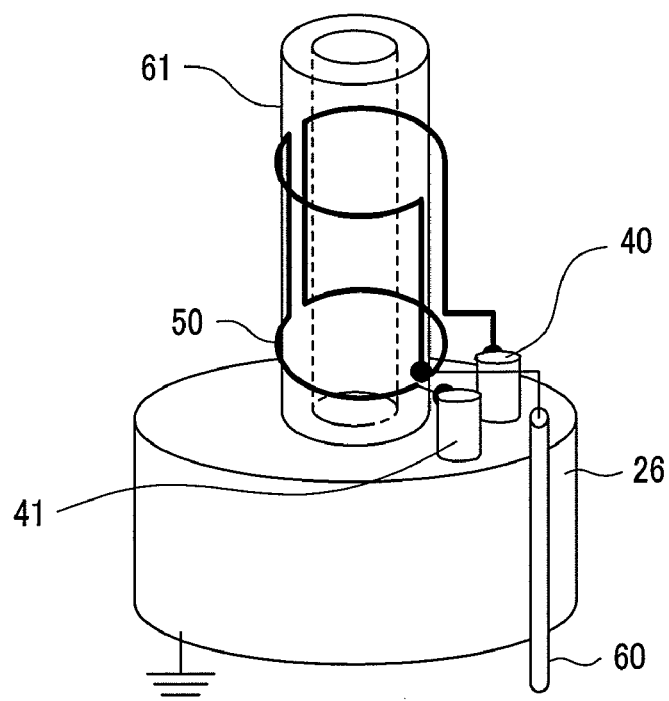
FIG. 13B is a perspective view schematically showing a manner of mounting the saddle-type probe antenna to a cryogenic probe 20.

FIG. 13B is a perspective view schematically showing a manner of mounting the saddle-shaped probe antenna to a cryogenic probe 20. A cylindrical bobbin 61 is fixed in the coaxial direction of the probe leading-end stage 26, and the antenna coil 50 is wound around the bobbin. The signal line 60 is connected to the generally middle point of the antenna coil 50, and the both ends of the coil are connected to the capacitors 40 and 41. The outer cover of the capacitors 40 and 41 or the signal line 60 is electrically and mechanically connected to the probe leading-end stage 26 made of a metallic material. The antenna coil 50 is made of a wire of a superconductor NbTi, and the cylindrical bobbin 61 is made of sapphire ($Al_2O_3$). In the present embodiment, the thickness of the NbTi wire is 1 mm, the diameter of the antenna coil is 7 mm, and the height of the antenna coil is 20 mm.

FIGS. 13A and 13B show the saddle coil of 1-turn×2, but a saddle coil of N-turn (N>1)×2 may be employed. In this case, it is a presupposition that the self-resonant frequency of the N-turn coil is higher than the series resonance frequency.

Although not shown, the probe leading-end stage 26 is thermally connected to the heat exchanger at the leading end of the cryocooler serving as a cryogenic source so as to be cooled to very low temperature. The probe leading-end stage 26 and the cylindrical bobbin 60 are also thermally connected to each other. Therefore, the antenna coil 50 is cooled to very low temperature with heat transmission through the cylindrical bobbin 61.

The resonance characteristic of the thus manufactured saddle-shaped probe antenna was evaluated in liquid helium (4.2 K). The resonance characteristic matched to 50 Ω at 300 to 600 MHz was confirmed, and the Q factor equivalent to that of the probe antenna in the embodiment 1 could be obtained. By using the probe antenna having the configuration described above to an NMR spectrometer, the great improvement in S/N ratio can be realized.

NbTi was used as the superconducting material in the embodiment 6. It is apparent that the same effect can be obtained when the other Nb alloy ($Nb_3Sn$), magnesium diboride ($MgB_2$), or oxide high-temperature superconductor such as YBCO is used for the superconducting material of the antenna coil in the same configuration. Further, it is apparent that the same configuration is possible when a normal metal material such as Cu wire is used instead of the superconducting material. Although sapphire is used for the cylindrical bobbin 61 in the embodiment 6, the same result can be obtained by using aluminum nitride (AlN) instead.

The embodiment 6 shows the antenna configuration of a low-temperature operation. However, even when the configuration of the present embodiment is applied to an antenna of a room-temperature operation using a normal metal such as Cu, the improvement in the sensitivity of the NMR spectroscopy can be realized compared to the conventional room-temperature operation antenna. The antenna configuration shown in the embodiment 6 in which the junction of the signal line is provided in the antenna coil can increase self-resonance frequency of the antenna coil compared to the conventional antenna in which the junction of the signal line is positioned at the end portion of the antenna coil. Therefore, the number of turns of the antenna coil can be increased, thereby being capable of enhancing the sensitivity of NMR spectroscopy. For example, although a solenoid-shaped antenna coil having four turns is difficult to be applied to the spectroscopy at 600 MHz in the conventional configuration, a solenoid-shaped antenna coil that has four turns, is operated at room temperature and to which the configuration of the embodiment 6 is applied can be applied for the spectroscopy at 600 MHz.

Embodiment 7

Figure 14:
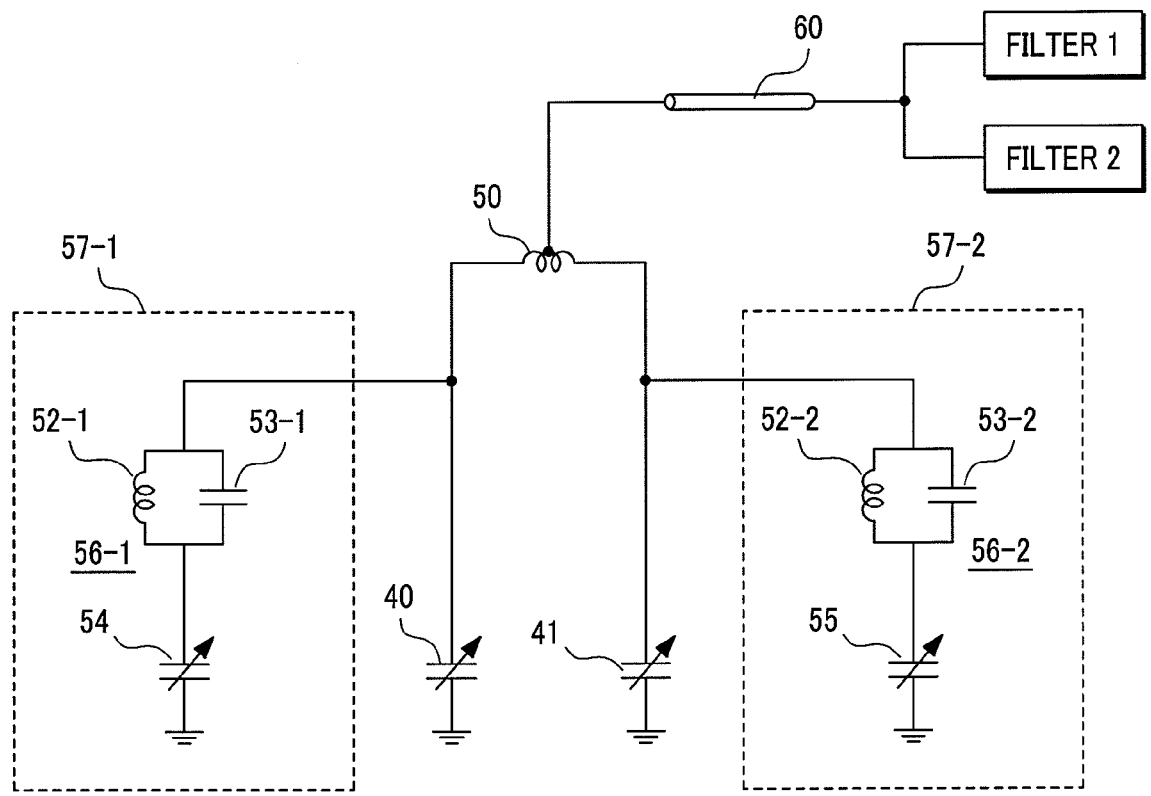
FIG. 14 is an electric equivalent circuit diagram of a double resonance probe antenna according to the embodiment 7.

The embodiment 7 proposes a double resonance probe antenna that can transmit and receive radio frequency signals of two different resonance frequencies by using a single antenna coil. FIG. 14 shows an electric equivalent circuit diagram of the antenna. A signal line 60 is drawn from a generally middle point of an antenna coil 50, and capacitors 40 and 41 are connected to end portions of the antenna coil 50. An trap filter 56-1 made of an inductor 52-1 and a capacitor 53-1 and a capacitor 54 are serially connected at the end portion of the antenna coil. The configuration same as the configuration of the trap filter 56-1 and the capacitor 54 is formed at the other end portion of the antenna coil.

The antenna circuit in the embodiment 7 is a circuit resonated at two different frequencies $F_A$ and $F_B$ ($F_A > F_B$). The capacitors 40 and 41 are used for tuning and matching the resonance peak of the resonance frequency $F_A$. On the other hand, the capacitors 54 and 55 are used for tuning and matching the resonance peak of the resonance frequency $F_B$. The trap filter 56-1 is a component circuit for blocking the radio frequency signal of the resonance frequency $F_A$, wherein the inductor 52-1 and the capacitor 53 are resonated in parallel to each other at the frequency $F_A$ so as to show extremely high impedance. The trap filter 56-2 performs the same operation.

At the frequency $F_A$, the component circuits 57-1 and 57-2 enclosed by a broken line are negligible, since there are trap filters 56-1 and 56-2, so that the circuit is substantially made of the antenna coil 50, and capacitors 40 and 41. Therefore, even if the capacitance values of the capacitors 54 and 55 are changed, the resonance characteristic at the resonance frequency $F_A$ is not affected. On the other hand, at the frequency $F_B$, the trap filters 56-1 and 56-2 behave as an inductor. The circuit is made of its inductance component, the antenna coil 50, and the capacitors 40, 41, 54, and 55. The resonance characteristic at the resonance frequency $F_B$ is affected not only by the capacitors 54 and 55 but also by the capacitors 40 and 41 that tunes and matches the resonance characteristic of the resonance frequency $F_A$. Therefore, in the antenna circuit in this embodiment, the capacitance values of the capacitors 40 and 41 are firstly adjusted to match the resonance characteristic of the frequency $F_A$ to 50 Ω, and then, the capacitance values of the capacitors 54 and 55 are adjusted to match the resonance characteristic of the resonance frequency $F_B$ to 50 Ω. By the procedure described above, two resonance characteristics of the resonance frequencies $F_A$ and $F_B$ are tuned and matched.

Filters 1 and 2 are arranged ahead of the branch point that is at the rear of the signal line 60. The filter 1 is a band-pass filter of the frequency $F_A$, while the filter 2 is a band-pass filter of the frequency $F_B$. The radio frequency signals of the frequencies $F_A$ and $F_B$ received by the antenna are transmitted through the signal line 60, and distributed at the branch point at the rear. By these filters, only a signal of the frequency $F_A$ is transmitted to one branch destination, and only a signal of the frequency $F_B$ is transmitted to the other branch destination. This configuration prevents that a leak signal of a different frequency is intermixed into a signal detector at the following stage of the filters.

Figure 15A:
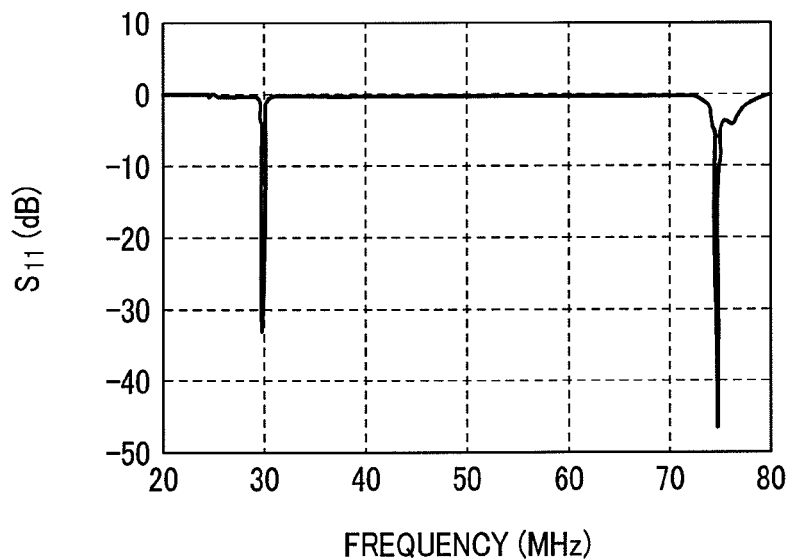
FIG. 15A shows a frequency dependency of a reflection coefficient ($S_{11}$) of the double resonance probe antenna according to the embodiment 7.
Figure 15B:
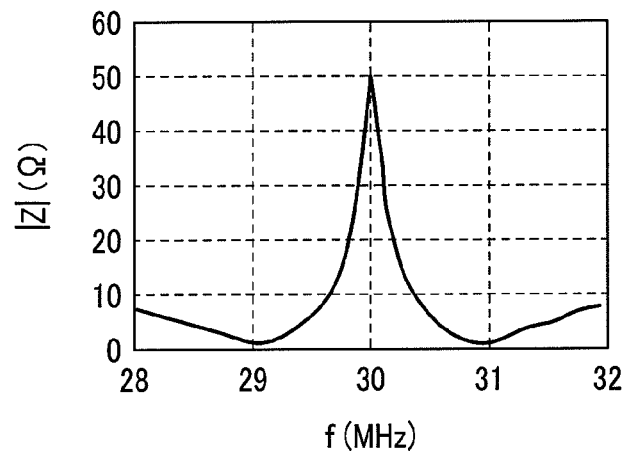
FIGS. 15B and 15C show frequency dependency of an impedance of the double resonance probe antenna according to the embodiment 6.
Figure 15C:
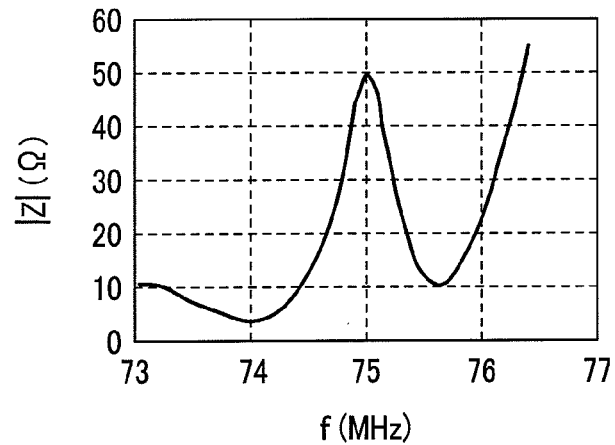

FIG. 15 shows a resonance characteristic of a double resonance antenna circuit according to the embodiment 7 that is designed and manufactured with the use of a normal metal Cu wire in which the resonance frequency $F_A$=300 MHz, and $F_B$=75 MHz. FIG. 15A shows a reflection characteristic ($S_{11}$) of the input impedance when the antenna is viewed from the leading end of the signal line 60. The resonance peak is confirmed at the frequency of 30 MHz and the frequency of 75 MHz. FIGS. 15B and 15C show a frequency dependency of the effusion cell at the vicinity of the frequency band of 30 MHz and 75 MHz when the antenna is viewed from the leading end of the signal line 60. It is confirmed from these graphs that impedance of the resonance peak at either one of the frequencies is matched to 50 Ω, and normal operation of the double resonance circuit using a single antenna coil can be confirmed.

According to the present embodiment, a single antenna coil can be simultaneously used for two frequencies, and a single antenna coil can be connected by a single signal line 60, whereby the probe can be miniaturized.

The tuning and matching of the resonance characteristic can be realized only by shifting each of the series resonance frequencies $F_1$ and $F_2$ in two series resonance circuits constituting the antenna circuit in the opposite directions with the resonance frequency $F_0$ of the nuclide, which is a subject to be measured, defined as a center, whereby the adjustment in the tuning and matching is facilitated. It is unnecessary to mount extra components, such as an inductor or capacitor, for impedance matching of the resonance characteristic, whereby the antenna circuit can easily be formed even in a narrow mounting space at the leading end of the probe.

Embodiment 8

Figure 16:
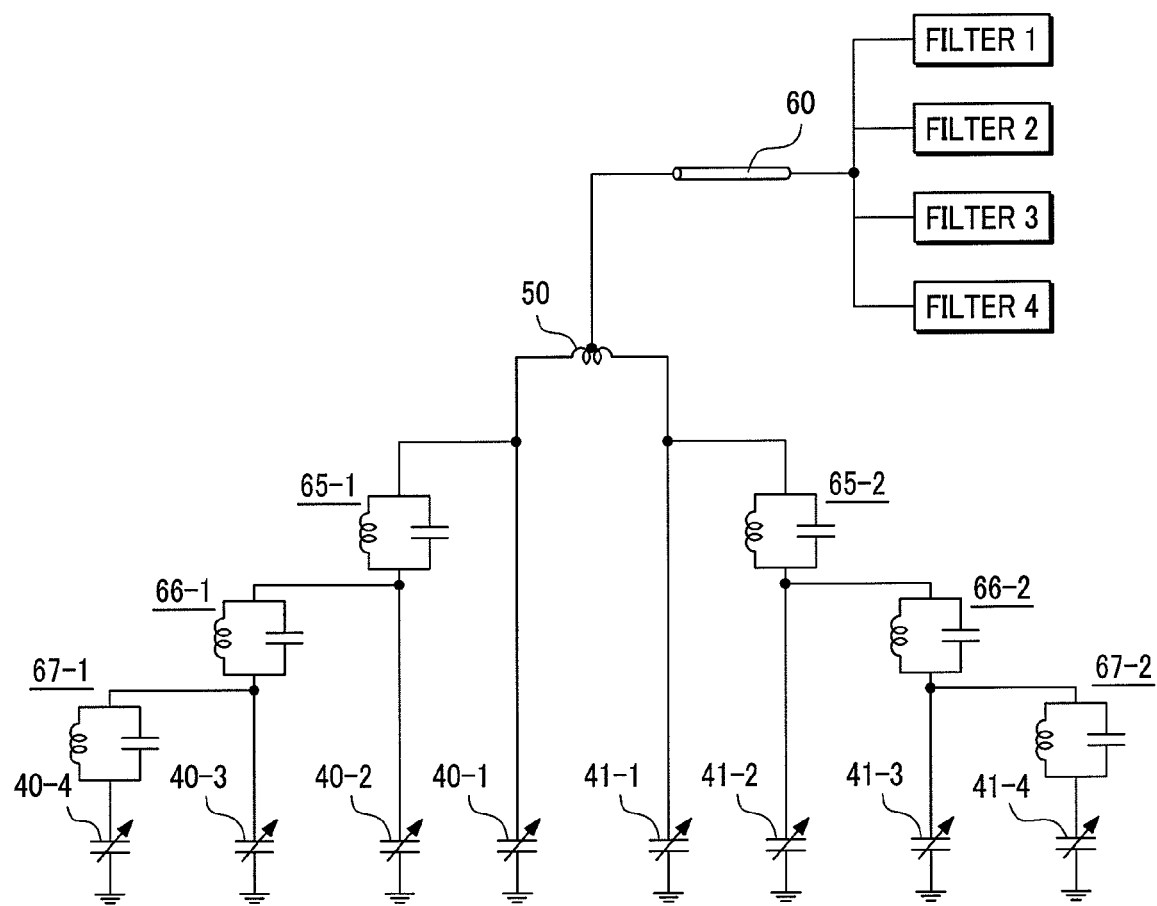
FIG. 16 is a circuit diagram of a fourfold resonance probe antenna according to the embodiment 8.

The embodiment 8 proposes a multiple resonance probe antenna that can transmit and receive radio frequency signals of four different resonance frequencies by using a single antenna coil. The embodiment 8 shows a circuit diagram that can be used as a multiple resonance probe antenna corresponding to nuclears H, D, C, and N. FIG. 16 shows an electric equivalent circuit diagram. The basic circuit configuration is the same as that in the embodiment 7. In the antenna circuit in the embodiment 8, more trap filters and capacitors are arranged so as to be capable of obtaining a resonance peak matched to 50 Ω in four resonance frequencies.

The antenna circuit shown in FIG. 16 was formed by using the antenna coil 50, trap filters 65-1 and 65-2 that block the radio frequency signal of 300 MHz, trap filters 66-1 and 66-2 that block the radio frequency signal of 75 MHz, and trap filters 67-1 and 67-2 that block the radio frequency signal of 46 MHz. Filters 1, 2, 3 and 4 are band-pass filters of 300 MHz, 75 MHz, 46 MHz, and 30 MHz, and these filters prevent that the leak signals of the different frequencies are intermixed into a signal detector at the following stage, like the embodiment 7. As a result of the evaluation of the frequency dependency of the effusion cell when the antenna is viewed from the signal line 60, the resonance peak whose impedance is matched to 50 Ω is obtained at 300 MHz, 75 MHz, 46 MHz, and 30 MHz.

According to the present embodiment, a single antenna coil can be simultaneously used for four frequencies, and a single antenna coil can be connected by a single signal line 60, whereby the probe can be miniaturized.

Embodiment 9

Figure 17A:
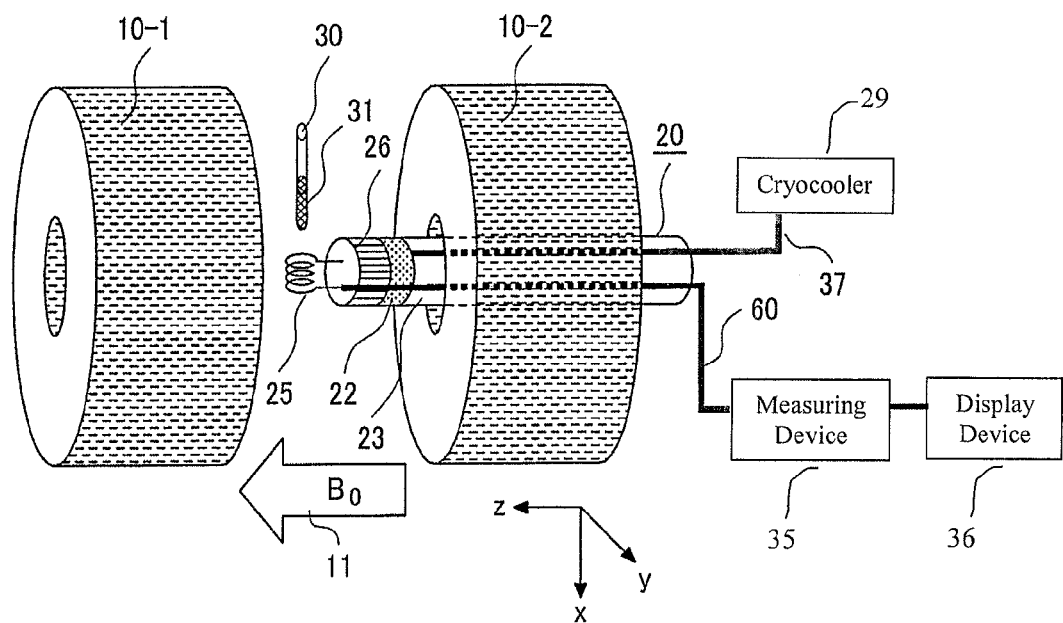
FIG. 17A is a view schematically showing a structure of an NMR spectrometer that produces a uniform magnetic field in the horizontal direction in the embodiment 9.
Figure 17B:
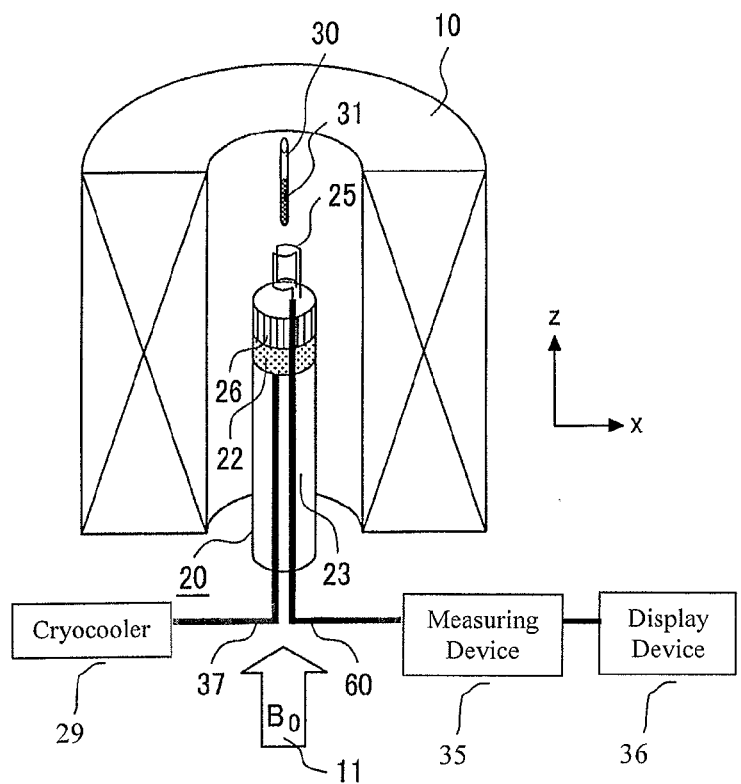
FIG. 17B is a view schematically showing a structure of an NMR spectrometer that produces a uniform magnetic field in the vertical direction in the embodiment 10.

The embodiment 9 proposes an NMR spectrometer having the probe antenna according to the present invention mounted thereto. FIG. 17 shows the configuration of the NMR spectrometer according to the embodiment 9. FIG. 17A is an NMR spectrometer that produces a uniform magnetic field in the horizontal direction by two-divided superconducting magnets 10-1 and 10-2, while FIG. 17B is an NMR spectrometer that produces a uniform magnetic field in the vertical direction by a cylindrical superconducting magnet 10. In both configurations, the NMR spectrometer is composed of the superconducting magnets 10, 10-1 and 10-2, cryogenic probe 20, cryocooler 29 for cooling the cryogenic probe 20, a measuring device 35 for transmitting a radio frequency signal to the probe and receiving and analyzing the signal from the probe, and a display device 36 that displays the result of the measurement. The cryocooler 29 circulates cooled He gas in a cooling gas line 37 so as to cool the heat exchanger 23 at the leading end of the cryogenic probe 20 and the probe leading-end stage 26. The measuring device 35 transmits a radio frequency signal to the probe antenna 25 through the signal line 60, and receives the radio frequency signal from the sample 31. The configuration in the present embodiment can realize a spectrometer that can receive and analyze a response signal from a nuclear spin exited by the irradiation of radio frequency magnetic field to a sample placed in a uniform static magnetic field.

A solenoid-shaped probe antenna can be applied to an NMR spectrometer that produces a uniform magnetic field in the horizontal direction shown in FIG. 17A. By applying any one of the configurations in the embodiments 1 to 5 to the probe antenna, a great improvement in the S/N ratio can be realized. On the other hand, a saddle-shaped probe antenna can be applied to an NMR spectrometer that produces a uniform magnetic field in the vertical direction shown in FIG. 17B. By applying the configuration in the embodiment 6 to the probe antenna, a great improvement in the S/N ratio can be realized.

Embodiment 10

Figure 18:
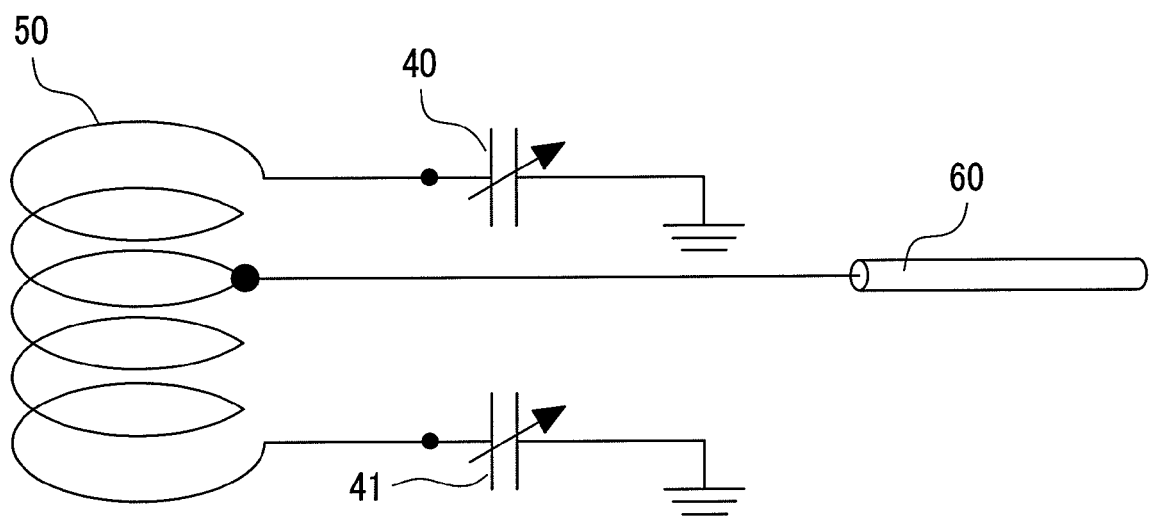
FIG. 18 is a view schematically showing a structure of a solenoid-type probe antenna according to the embodiment 10.

The embodiment 10 proposes a solenoid-shaped probe antenna in which a signal line is connected at the point apart from the generally middle point of the antenna coil. FIG. 18 shows the structure of the probe antenna according to the embodiment 10. The basic structure is the same as that in the embodiment 1. The number of the turns of the antenna coil is five, and the signal line 60 is connected to the point where the antenna coil is divided into two turns and three turns.

The mounting manner to the cryogenic probe and the cooling method of the antenna coil are the same as those shown in the embodiment 1. A wire of superconducting NbTi was used to manufacture the antenna coil, and the resonance characteristic was evaluated in liquid helium (4.2 K). As a result, the resonance frequency matched to 50 Ω at 300 to 600 MHz was confirmed, and the Q factor equivalent to that of the probe antenna in the embodiment 1 could be obtained. By using the probe antenna having the configuration described above to an NMR spectrometer, the great improvement in S/N ratio can be realized.

NbTi was used as the superconducting material in the embodiment 10. It is apparent that the same effect can be obtained when the other Nb alloy ($Nb_3Sn$), magnesium diboride ($MgB_2$), or oxide high-temperature superconductor such as YBCO is used for the superconducting material of the antenna coil in the same configuration. Further, it is apparent that the same configuration is possible when a normal metal material such as Cu wire is used instead of the superconducting material.

The embodiment 10 shows the antenna configuration of a low-temperature operation. However, even when the configuration of the present embodiment is applied to an antenna of a room-temperature operation using a normal metal such as Cu, the improvement in the sensitivity of the NMR spectroscopy can be realized compared to the conventional room-temperature operation antenna. The antenna configuration shown in the embodiment 10 in which the junction of the signal line is provided in the antenna coil can increase self-resonance frequency of the antenna coil compared to the conventional antenna in which the junction of the signal line is positioned at the end portion of the antenna coil. Therefore, the number of turns of the antenna coil can be increased, thereby being capable of enhancing the sensitivity of NMR spectroscopy. For example, although a solenoid-shaped antenna coil having five turns is difficult to be applied to the spectroscopy at 600 MHz in the conventional configuration, a solenoid-shaped antenna coil that has five turns, is operated at room temperature and to which the configuration of the embodiment 10 is applied can be applied for the spectroscopy at 600 MHz.

The explanation of the numerals used in the drawings of the present application is as follows.

What is claimed is:

1. A nuclear magnetic resonance (NMR) probe comprising:
    an antenna coil that has both ends transmitting a radio frequency (RF) signal to a sample placed in a uniform magnetic field with a predetermined resonance frequency and receiving a free induction decay (FID) signal from the sample;
    a signal line that transmits the RF signal from the antenna coil and the FID signal to the antenna coil;
    a stage to which the antenna coil is fixed; and
    a probe housing that holds the stage,
    wherein:
        the antenna coil has a turn section made of a conductor formed between both ends;
        a first capacitor has one end connected to a first extension line extended from one end of the antenna coil and another end grounded;
        a second capacitor has one end connected to a second extension line extended from the other end of the antenna coil and another end grounded; and a third extension line to the signal line is connected to a junction formed on the turn section apart from the one end or the other end of the antenna coil by a predetermined distance.

2. The NMR probe according to claim 1, wherein the predetermined distance is within 30% to 70% of the distance from the one end to the other end of the antenna coil.

3. The NMR probe according to claim 1, wherein the antenna coil has one of a solenoid shape and a saddle shape.

4. The NMR probe according to claim 1, wherein the antenna coil is made of one of a normal metal material, a superconducting material, and a copper oxide superconducting material.

5. The NMR probe according to claim 4, wherein the normal metal material is copper (Cu), the superconducting material is selected from one of a niobium (Nb) alloy including Nb, NbTi, $Nb_3Al$, a lead (Pb) alloy including Pb and PbIn, and a magnesium diboride ($MgB_2$), and the copper oxide superconducting material is a yttrium barium copper oxide (YBCO).

6. The NMR probe according to claim 1, wherein both ends of the antenna coil are open.

7. The NMR probe according to claim 1, wherein the antenna coil is made of a wire of one of a normal metal material and a superconducting material.

8. The NMR probe according to claim 1, wherein the antenna coil is composed of a thin film formed on one of a flat substrate and a curved substrate, and is made of one of a normal metal material and a superconducting material.

9. The NMR probe according to claim 1, wherein:
the antenna coil composes a circuit having a first series resonance circuit that the turn section formed between the one end of the antenna coil and the junction has and that is made of a first inductor and a first capacitor, and a second series resonance circuit that the turn section formed between the other end of the antenna coil and the junction has and that is made of a second inductor and a second capacitor, the first series resonance circuit and the second series resonance circuit being connected in parallel to each other; and
the series resonance frequencies of the first and second series resonance circuits are shifted in an opposite direction from a predetermined resonance frequency, in order that the impedance at the predetermined resonance frequency is matched to a desired value.

10. An NMR probe comprising:
an antenna coil that has both ends transmitting a radio frequency (RF) signal to a sample placed in a uniform magnetic field with a predetermined resonance frequency and receiving a free induction decay (FID) signal from the sample;
a signal line that transmits each of the signals to the antenna coil;
a stage to which the antenna coil is fixed; and
a probe housing that holds the stage,
wherein:
the antenna coil has a turn section made of a conductor formed between both ends of the antenna coil, and is composed of a first antenna coil having a first turn section that is made of a conductor, has one end connected to a first capacitor through a first extension line, and has the other end connected to a connection terminal through a second extension line, and a second antenna coil having a second turn section that is made of a conductor, has one end connected to a second capacitor through a third extension line, and has the other end connected to the connection terminal through a fourth extension line;
other ends of the first and second capacitors are grounded; and
a fifth extension line connected to the signal line is connected to the connection terminal.

11. The NMR probe according to claim 10, wherein the antenna coil has one of a solenoid shape and a saddle shape.

12. The NMR probe according to claim 10, wherein the antenna coil is made from one of a normal metal material, a superconducting material, and a copper oxide superconducting material.

13. The NMR probe according to claim 12, wherein the normal metal material is copper (Cu), the superconducting material is selected from one of a niobium (Nb) alloy including Nb, NbTi, $Nb_3Al$, a lead (Pb) alloy including Pb and PbIn, and a magnesium diboride ($MgB_2$), and the copper oxide superconducting material is a yttrium barium copper oxide (YBCO).

14. The NMR probe according to claim 10, wherein the antenna coil is made of one of a wire and a thin film on a substrate, the wire being made of one of a normal metal material and a superconducting material, and the thin film being made of one of a normal metal layer and a superconducting layer formed on the substrate.

15. The NMR probe according to claim 10, wherein:
the antenna coil has a turn section made of a conductor wound around a side face of a bobbin, and is composed of a first antenna coil having a first turn section that is made of a conductor, has one end connected to a first capacitor through a first extension line, and has the other end connected to a connection terminal through a second extension line, and a second antenna coil having a second turn section that is made of a conductor, has one end connected to a second capacitor through a third extension line, and has the other end connected to the connection terminal through a fourth extension line; and
the connection terminal is formed on the side face of the bobbin, and connected to the signal line through a fifth extension line.

16. The NMR probe according to claim 15, wherein the connection terminal is formed at the position outwardly apart from the side face of the bobbin by a predetermined distance.

17. The NMR probe according to claim 15, wherein:
the first extension line, the first turn section, and the second extension line are made of a continuous material of the same type; and
the third extension line, the second turn section, and the fourth extension line are made of a continuous material of the same type.

18. The NMR probe according to claim 15, wherein the first extension line, the first turn section, the second extension line, the third extension line, the second turn section, and the fourth extension line are made of a continuous material of the same type.

19. An NMR spectrometer comprising:
at least one superconducting magnet that has a hollow portion and produces a uniform static magnetic field;
an NMR probe composed of an antenna coil that has both ends transmitting a radio frequency signal to a sample placed in the uniform static magnetic field with a predetermined resonance frequency and receiving a free induction decay (FID) signal from the sample, a stage to which the antenna coil is fixed, and a probe housing for holding the stage, the NMR probe being inserted into the hollow portion of the magnet; and a measuring device that transmits and receives a signal through a transmission line that propagates the signals to the antenna coil, wherein:

the antenna coil has a turn section made of a conductor formed between both end portions;

a first capacitor is connected to a first extension line extended from one end portion of the antenna coil;

a second capacitor is connected to a second extension line extended from the other end portion of the antenna coil;

the other ends of the first and second capacitors are grounded; and a third extension line to the signal line is connected to a junction formed on the turn section apart from the one end portion or the other end portion by a predetermined distance.

20. The NMR spectroscopy according to claim 19, wherein the predetermined distance is within 30% to 70% of the distance from the one end portion to the other end portion.

21. The NMR spectroscopy according to claim 19, wherein the antenna coil has one of a solenoid shape and a saddle shape.

22. The NMR spectroscopy according to claim 19, wherein the antenna coil is made of one of a wire and a thin film formed on a substrate, the wire being made from one of a normal metal material and a superconducting material, and the thin film being made from one of a normal metal layer and a superconducting layer formed on the substrate.

* * * * *